United States Patent
Yu et al.

(10) Patent No.: US 11,245,073 B2
(45) Date of Patent: Feb. 8, 2022

(54) SWITCHING ELEMENT, VARIABLE RESISTANCE MEMORY DEVICE, AND METHOD OF MANUFACTURING THE SWITCHING ELEMENT

(71) Applicant: SAMSUNG ELECTRONICS CO., LTD., Suwon-si (KR)

(72) Inventors: Seung-Geun Yu, Hwaseong-si (KR); Zhu Wu, Seoul (KR); Ja Bin Lee, Hwaseong-si (KR); Jung Moo Lee, Seoul (KR); Jinwoo Lee, Seoul (KR); Kyubong Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 16/944,350

(22) Filed: Jul. 31, 2020

(65) Prior Publication Data

US 2020/0365801 A1    Nov. 19, 2020

Related U.S. Application Data

(63) Continuation-in-part of application No. 16/364,232, filed on Mar. 26, 2019, now Pat. No. 10,777,745.

(30) Foreign Application Priority Data

Sep. 4, 2018    (KR) .................. 10-2018-0105378

(51) Int. Cl.
*H01L 45/00* (2006.01)
*H01L 27/24* (2006.01)

(52) U.S. Cl.
CPC ...... *H01L 45/1233* (2013.01); *H01L 27/2409* (2013.01); *H01L 27/2481* (2013.01); *H01L 45/126* (2013.01); *H01L 45/1253* (2013.01); *H01L 45/1293* (2013.01)

(58) Field of Classification Search
CPC .. H01L 45/1253–1273; G11C 2213/52; G11C 2213/35
See application file for complete search history.

(56) References Cited

U.S. PATENT DOCUMENTS

| | | | |
|---|---|---|---|
| 5,177,567 A | 1/1993 | Kiersy et al. | |
| 5,825,046 A | 10/1998 | Czubatyj et al. | |
| 8,598,010 B2 | 12/2013 | Joo et al. | |
| 8,841,634 B2 | 9/2014 | Statham et al. | |
| 8,916,973 B1 | 12/2014 | Kim et al. | |
| 9,543,515 B2 | 1/2017 | Gealy et al. | |

(Continued)

FOREIGN PATENT DOCUMENTS

| | | |
|---|---|---|
| KR | 101064219 B1 | 9/2011 |
| KR | 1020160061746 A | 6/2016 |

(Continued)

*Primary Examiner* — Scott B Geyer
(74) *Attorney, Agent, or Firm* — Volentine, Whitt & Francos, PLLC

(57) ABSTRACT

A switching element includes a lower barrier electrode on a substrate, a switching pattern on the lower barrier electrode, and an upper barrier electrode on the switching pattern. The lower barrier electrode includes a first lower barrier electrode layer, and a second lower barrier electrode layer interposed between the first lower barrier electrode layer and the switching pattern and whose density is different from the density of the first lower barrier electrode.

20 Claims, 26 Drawing Sheets

(56) References Cited

U.S. PATENT DOCUMENTS

| | | | |
|---|---|---|---|
| 9,722,172 B2 | 8/2017 | Park et al. | |
| 2007/0108430 A1 | 5/2007 | Lung | |
| 2008/0247226 A1 | 10/2008 | Liu et al. | |
| 2009/0219755 A1* | 9/2009 | Zaidi | H01L 45/16 365/163 |
| 2009/0303780 A1 | 12/2009 | Kasko et al. | |
| 2010/0084625 A1 | 4/2010 | Wicker et al. | |
| 2012/0241705 A1* | 9/2012 | Bresolin | H01L 45/16 257/2 |
| 2014/0117302 A1 | 5/2014 | Goswami | |
| 2015/0357566 A1* | 12/2015 | Wang | H01L 45/1253 257/4 |
| 2016/0359110 A1 | 12/2016 | Banno et al. | |
| 2017/0244028 A1* | 8/2017 | Wang | H01L 45/1683 |
| 2017/0271581 A1 | 9/2017 | Seong et al. | |
| 2019/0044060 A1 | 2/2019 | Russell et al. | |
| 2019/0172502 A1 | 6/2019 | Jeong et al. | |
| 2019/0189691 A1* | 6/2019 | Lee | H01L 45/147 |
| 2019/0259946 A1 | 8/2019 | Makala et al. | |
| 2020/0006650 A1* | 1/2020 | Wang | H01L 45/085 |

FOREIGN PATENT DOCUMENTS

| | | |
|---|---|---|
| KR | 1 01709323 B1 | 2/2017 |
| KR | 1020170108599 A | 9/2017 |
| KR | 1020170112608 A | 10/2017 |
| KR | 101835709 B1 | 3/2018 |
| KR | 101854023 B1 | 5/2018 |

* cited by examiner

SWITCHING ELEMENT, VARIABLE RESISTANCE MEMORY DEVICE, AND METHOD OF MANUFACTURING THE SWITCHING ELEMENT

PRIORITY STATEMENT

This application is a continuation-in-part application of U.S. application Ser. No. 16/364,232, filed Mar. 26, 2019, which claims priority under 35 U.S.C. § 119 to Korean Patent Application No. 10-2018-0105378, filed on Sep. 4, 2018, in the Korean Intellectual Property Office, the disclosure of which is hereby incorporated by reference in its entirety.

BACKGROUND

The inventive concepts relate to a semiconductor device. More particularly, a variable resistance memory device, to a switching element of a variable resistance memory device, and to a method of manufacturing the switching element.

Generally, semiconductor memory devices may be classified as volatile memory devices and non-volatile memory devices. Volatile memory devices lose their stored data when their power supplies are interrupted. Volatile memory devices include dynamic random access memory (DRAM) devices and static random access memory (SRAM) devices. On the contrary, non-volatile memory devices retain their stored data even when their power supplies are interrupted. Non-volatile memory devices include programmable ROMs (PROMs), erasable PROMs (EPROMs), electrically EPROMs (EEPROMs), and flash memory devices.

In addition, next-generation semiconductor memory devices (e.g., ferroelectric random access memory (FRAM) devices, magnetic random access memory (MRAM) devices, and phase-change random access memory (PRAM) devices) have been developed to provide high-performance and low power consumption semiconductor memory devices. Materials of these next-generation semiconductor memory devices have resistance values that vary according to currents or voltages applied thereto and retain their resistance values even when currents or voltages are interrupted.

SUMMARY

According to an aspect of the inventive concepts, there is provided a switching element including a lower barrier electrode, a switching pattern on the lower barrier electrode, and an upper barrier electrode on the switching pattern. Each of the lower barrier electrode and the upper barrier electrode includes carbon, and the lower barrier electrode further includes a larger amount of an inert gas element than the upper barrier electrode.

According to an aspect of the inventive concepts, there is also provided a switching element including a lower barrier electrode on a substrate, a switching pattern on the lower barrier electrode, and an upper barrier electrode on the switching pattern. The upper barrier electrode comprises a first upper barrier electrode, and a second upper barrier electrode disposed on the first upper barrier electrode. The second upper barrier electrode includes a larger amount of an inert gas element than the first upper barrier electrode.

According to an aspect of the inventive concepts, there is also provided a variable resistance memory device including a first conductive line extending in a first direction, a second conductive line extending in a second direction intersecting the first direction, a variable resistance structure disposed between the first and second conductive lines, and a switching element disposed between the variable resistance structure and the second conductive line or between the variable resistance structure and the first conductive line. The switching element comprises a lower barrier electrode, a switching pattern on the lower barrier electrode, and an upper barrier electrode on the switching pattern. Each of the lower barrier electrode and the upper barrier electrode includes carbon, and the lower barrier electrode further includes a larger amount of an inert gas element than the upper barrier electrode.

BRIEF DESCRIPTION OF THE DRAWINGS

The inventive concepts will become more apparent in view of the attached drawings and accompanying detailed description.

DETAILED DESCRIPTION

Figure 1:
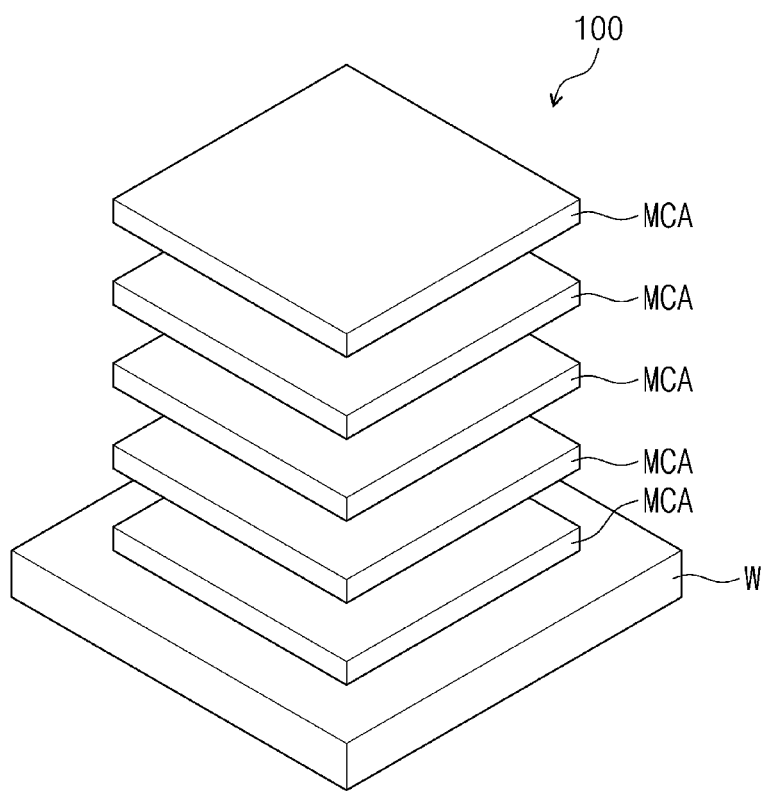
FIG. 1 is a perspective view of an example of a variable resistance memory device according the inventive concepts.

Referring to FIG. 1, a variable resistance memory device 100 according to the inventive concepts may include a plurality of memory cell arrays MCA sequentially stacked on a substrate W. Each of the memory cell arrays MCA may include a two-dimensional array of variable resistance memory cells. The variable resistance memory device 100 may further include conductive lines (not shown) which are disposed between the memory cell arrays and are used to write data to, read data from and/or erase the variable resistance memory cells. FIG. 1 illustrates a stack of five memory cell arrays MCA. However, the inventive concepts are not limited thereto.

Figure 2:
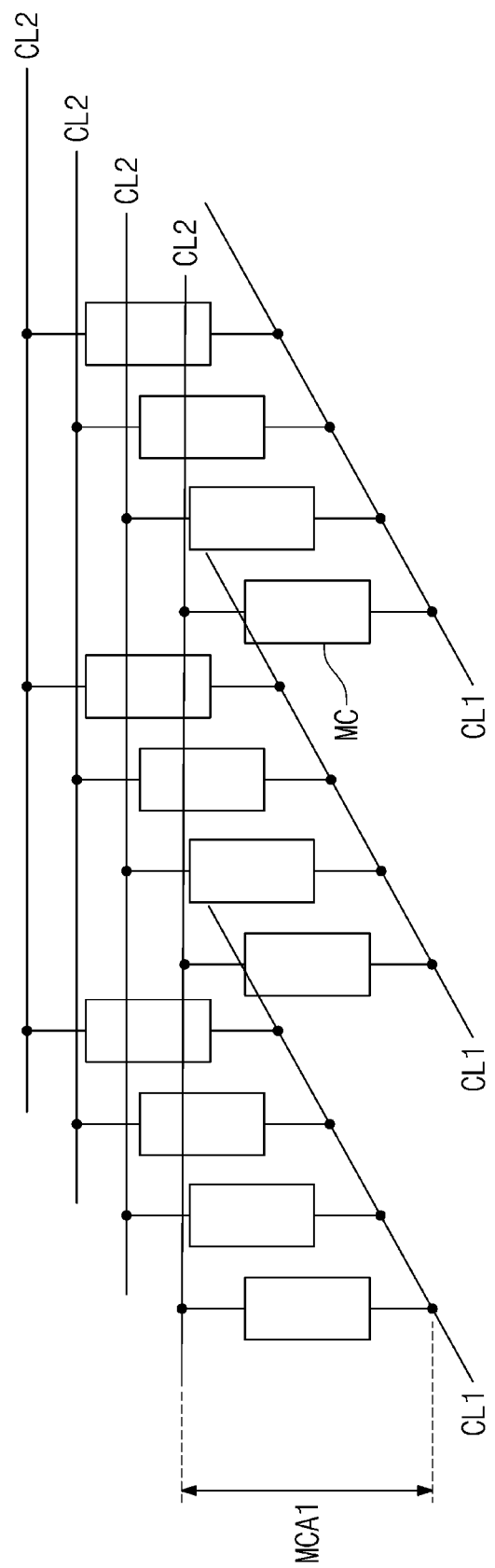
FIG. 2 is a circuit diagram of a memory cell stack of the variable resistance memory device of FIG. 1.

FIG. 2 is a circuit diagram of one of the memory cell arrays of FIG. 1. A first memory cell array MCA1 is illustrated as an example in FIG. 2. The first memory cell array MCA1 may include memory cells MC disposed at intersecting points, as viewed in plan, of first conductive lines CL1 and second conductive lines CL2. Although not shown in FIG. 2, a second memory cell array may be provided on the first memory cell array MCA1. Like the first memory cell array MCA1, the second memory cell array may include memory cells provided at intersecting points of third conductive lines and fourth conductive lines. For example, the third conductive lines are separate conductive lines vertically spaced apart from the second conductive lines CL2. Alternatively, the second memory cell array may share the second conductive lines CL2 with the first memory cell array MCA1. In this case, the third conductive lines correspond to the second conductive lines CL2. The memory cells MC of the first memory cell array MCA1 may be two-dimensionally arrayed on the substrate W to constitute rows and columns.

Figure 3:
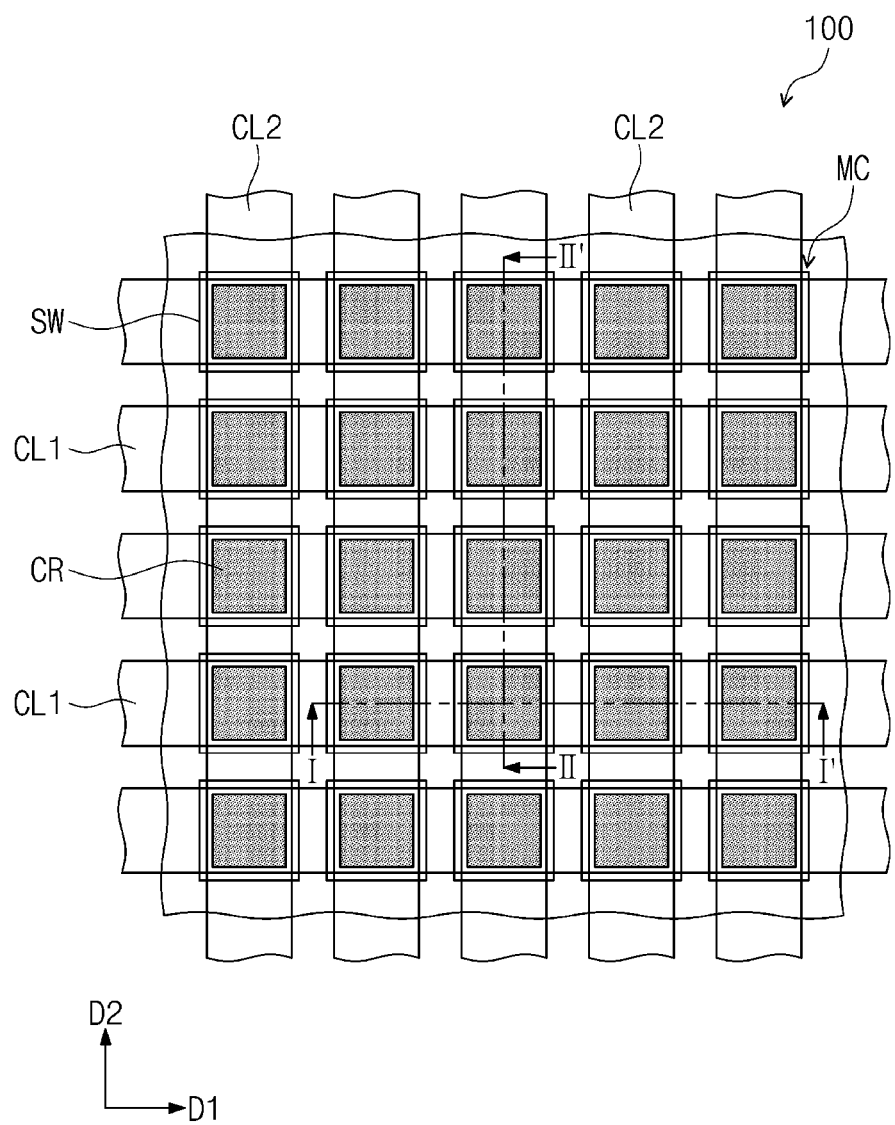
FIG. 3 is a plan view of examples of a variable resistance memory device according to the inventive concepts.
Figure 4:
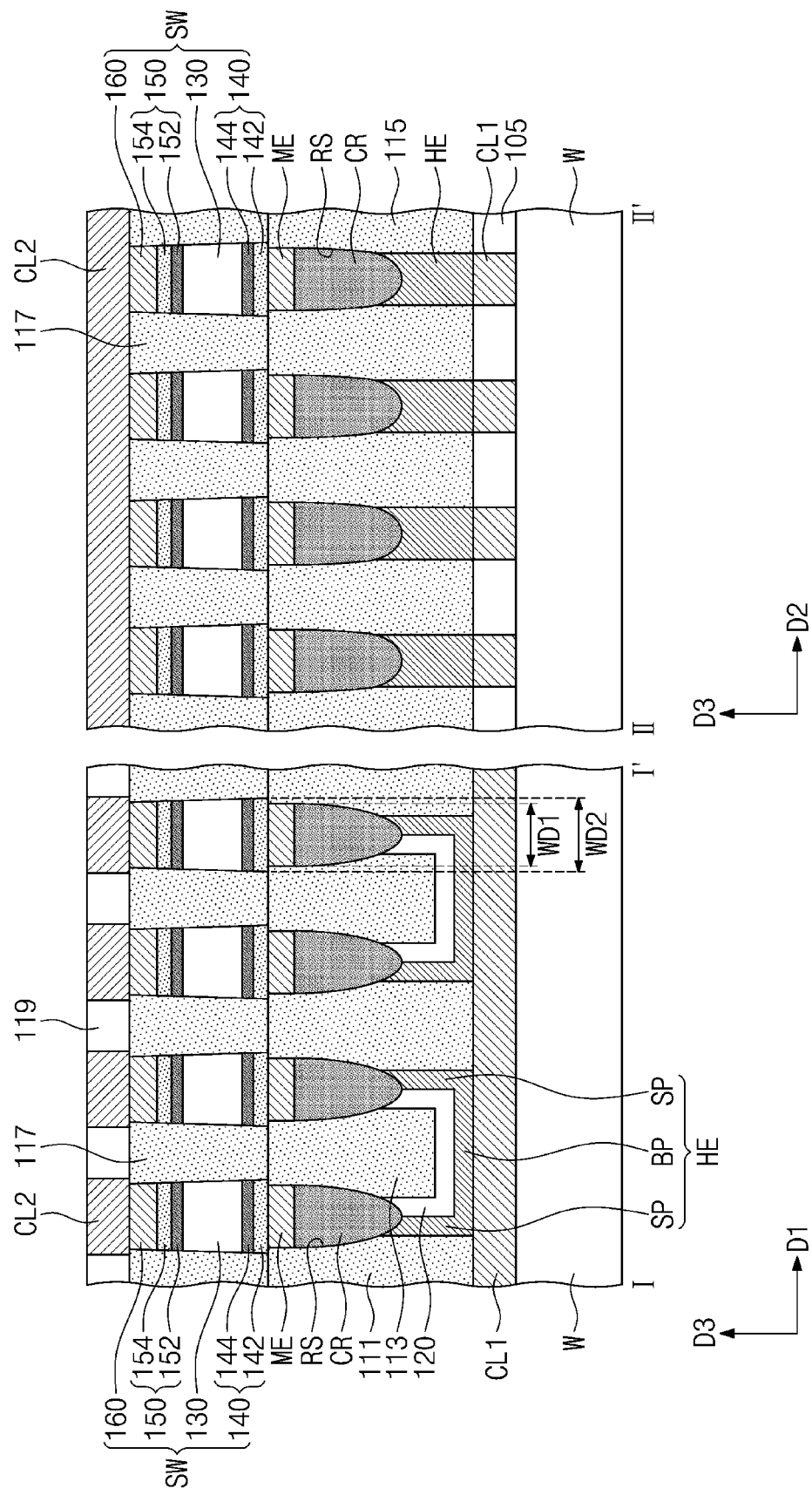
FIG. 4 is a cross-sectional view of one example of a variable resistance memory device according to the inventive concepts taken along lines I-I' and II-II' of FIG. 3.

FIG. 3 is a plan view of the first and second conductive lines CL1 and CL2 and the memory cells MC represented in the circuit diagram of FIG. 2. FIG. 4 is a cross-sectional view taken along lines I-I' and II-II' of FIG. 3. FIGS. 2, 3 and 4 may together illustrate an example of a variable resistance memory device according to the inventive concepts.

Referring to FIGS. 3 and 4, the first conductive lines CL1 may extend in a first direction D1 on the substrate W, and the second conductive lines CL2 may extend in a second direction D2 on the substrate W. The substrate W may include a single-crystalline semiconductor material. For example, the substrate W may be a silicon substrate, a silicon-on-insulator (SOI) substrate, a germanium substrate, a germanium-on-insulator (GOI) substrate or a silicon-germanium (SiGe) substrate. The first conductive lines CL1 may be word lines, and the second conductive lines CL2 may be bit lines. Alternatively, the first conductive lines CL1 may be bit lines, and the second conductive lines CL2 may be word lines. The first and second conductive lines CL1 and CL2 include a conductive material such as copper or aluminum. The first and second conductive lines CL1 and CL2 may further include a conductive metal nitride such as TiN or WN. The first conductive lines CL1 may be provided in a lower insulating layer 105. The second conductive lines CL2 may be provided in an upper insulating layer 119. The lower insulating layer 105 and the upper insulating layer 119 may each be a silicon oxide or silicon oxynitride layer.

The memory cells MC are interposed between the first conductive lines CL1 and the second conductive lines CL2. In examples of the present inventive concepts, each of the memory cells MC includes a variable resistor and a switch, respectively referred to hereinafter as variable resistance structure CR and a switching element SW. The variable resistance structure CR may be connected to the first conductive line CL1. The variable resistance structure CR has a resistance value which is variable to store logic data. The switching element SW may be connected to the second conductive line CL2. The switching element SW may connect the second conductive line CL2 to the variable resistance structure CR when a voltage higher than a threshold voltage ($V_{th}$) of the switching element SW is impressed across the switching element, i.e., the switching element SW selectively electrically conductively connects the variable resistance structure CR to the second conductive line CL2. The memory cell MC may further include an intermediate electrode ME between the variable resistance structure CR and the switching element SW. The variable resistance structure CR may be provided between the switching element SW and the substrate W. Alternatively, the switching element SW is provided between the variable resistance structure CR and the substrate W. Hereinafter, an example in which the variable resistance structure CR is provided between the first conductive line CL1 and the switching element SW will be described for the purpose of ease and convenience of explanation although the inventive concepts are not limited thereto.

The variable resistance structure CR may be provided in a recess RS formed in first to third interlayer insulating layers 111, 113 and 115 on the first conductive line CL1. The first to third interlayer insulating layers 111, 113 and 115 may each be a silicon nitride or silicon oxynitride layer. A plurality of the recesses RS may be respectively disposed at intersecting points of the first conductive lines CL1 and the second conductive lines CL2 and may be two-dimensionally arranged, when viewed in a plan view. Alternatively, the variable resistance structure CR may have a line shape extending in the first direction D1 or the second direction D2.

The variable resistance structure CR may be formed of at least one material capable of storing logical data. When the variable resistance memory device 100 is a phase change memory device, the variable resistance structure CR includes a material having a phase transition temperature across which its phase changes between a crystalline phase and an amorphous phase.

For example, a phase transition temperature between the crystalline and amorphous phases of the variable resistance structure CR may range from about 250 degrees Celsius to about 350 degrees Celsius. The variable resistance structure CR may be formed of a compound that includes at least one of Te and Se (i.e., chalcogenide elements) and at least one material selected from the group consisting of Ge, Sb, Bi, Pb, Sn, Ag, As, S, Si, In, Ti, Ga, P, O, and C. For example, the variable resistance structure CR may include a layer (pattern) of GeSbTe, GeTeAs, SbTeSe, GeTe, SbTe, SeTeSn, GeTeSe, SbSeBi, GeBiTe, GeTeTi, InSe, GaTeSe or InSbTe. For example, the variable resistance structure CR may include at least one of a binary compound (e.g., GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb), a ternary compound (e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS), a quaternary compound (e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS), or a quinary compound (e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, or GeSbSeZnSn). In certain examples, the variable resistance structure CR may have a superlattice structure in which layers including Ge and layers not including Ge are repeatedly and alternately stacked. For example, the variable resistance structure CR may have a structure in which GeTe layers and SbTe layers are repeatedly and alternately stacked. In addition, the variable resistance structure CR may include at least one of B, C, N, O, P, Ca, W, Ti, Hf, or Zr.

In certain examples, the variable resistance structure CR includes at least one material selected from the group of perovskite compounds and the group of conductive metal oxides. For example, the variable resistance structure CR may include a layer (pattern) of niobium oxide, titanium oxide, nickel oxide, zirconium oxide, vanadium oxide, (Pr, Ca)MnO$_3$ (PCMO), strontium-titanium oxide, barium-strontium-titanium oxide, strontium-zirconium oxide, barium-zirconium oxide, or barium-strontium-zirconium oxide. When the variable resistance structure CR includes a transition metal oxide, a dielectric constant of the variable resistance structure CR is greater than a dielectric constant of silicon oxide. In certain examples, the variable resistance structure CR has a double-layer structure of a conductive metal oxide layer and a tunnel insulating layer. In certain other examples, the variable resistance structure CR has a triple-layer structure of a first conductive metal oxide layer, a tunnel insulating layer and a second conductive metal oxide layer. The tunnel insulating layer may include aluminum oxide, hafnium oxide, or silicon oxide.

A heater electrode HE may be provided between the first conductive line CL1 and the variable resistance structure CR. The heater electrode HE may connect respective ones of the variable resistance structures CR, adjacent to each other in the first direction D1, to the first conductive line CL1. For example, the heater electrode HE may include a horizontal portion BP connected to the first conductive line CL1, and a pair of vertical portions SP extending from ends of the horizontal portion BP to the variable resistance structures CR, respectively. Alternatively, a plurality of the heater electrodes HE may be respectively disposed at the intersecting points of the first conductive lines CL1 and the second conductive lines CL2 and may be two-dimensionally arranged. The heater electrode HE serves to heat the variable resistance structure CR to change the phase of the variable resistance structure CR. The heater electrode HE may be formed of a material whose resistivity is greater than that of the first conductive line CL1. For example, the heater electrode HE may include at least one layer (pattern) of material selected from the group consisting of W, Ti, Al, Cu, C, CN, TiN, TiAlN, TiSiN, TiCN, WN, CoSiN, WSiN, TaN, TaCN, TaSiN, or TiO.

A spacer pattern 120 may be provided between the heater electrode HE and the second interlayer insulating layer 113.

The spacer pattern 120 may extend along the horizontal portion BP and the vertical portions SP of the heater electrode HE. The spacer pattern 120 may be formed of silicon oxide and/or silicon oxynitride.

A lower portion of the recess RS may be occupied by the variable resistance structure CR, and an upper portion of the recess RS may be occupied by the intermediate electrode ME. The intermediate electrode ME electrically connects the variable resistance structure CR and the switching element SW and prevents the variable resistance structure CR from being in direct contact with the switching element SW. The intermediate electrode ME may include at least one layer (pattern) of material selected from the group consisting of W, Ti, Al, Cu, C, CN, TiN, TiAlN, TiSiN, TiCN, WN, CoSiN, WSiN, TaN, TaCN, and TaSiN. Top surfaces of the first to third interlayer insulating layers 111, 113 and 115 may be substantially coplanar with a top surface of the intermediate electrode ME. Alternatively, the intermediate electrode ME may be provided on the first to third interlayer insulating layers 111, 113 and 115.

The switching element SW may be disposed on the intermediate electrode ME. In some examples, the switching element SW includes an ovonic threshold switch (OTS) element having a bi-directional characteristic. The switching element SW may include an element based on a threshold switching phenomenon having a nonlinear I-V curve (e.g., a S-shaped I-V curve). In some examples, the switching element SW includes a switching pattern 130, a lower barrier electrode 140, an upper barrier electrode 150, and an upper electrode 160.

The switching pattern 130 may be disposed on the lower barrier electrode 140. The switching pattern 130 may have a phase transition temperature between crystalline and amorphous phases, which is higher than that of the variable resistance structure CR. For example, the phase transition temperature of the switching pattern 130 may range from about 350 degrees Celsius to about 450 degrees Celsius. Thus, when an example of the variable resistance memory device 100 according to the inventive concepts is operated, the phase of the variable resistance structure CR may be reversibly changed between the crystalline and amorphous phases by an operating voltage (e.g., a program voltage), but a substantially amorphous state of the switching pattern 130 may be maintained without phase change even though the operating voltage is applied thereto. In the present specification, the term 'substantially amorphous state' refers to a completely amorphous state but also a case in which a grain boundary or a crystallized portion locally exists in a portion of the material being described. The switching pattern 130 may be formed of a compound that includes at least one of Te and Se (i.e., at least one chalcogenide element) and at least one material selected from the group consisting of Ge, Sb, Bi, Al, Pb, Sn, Ag, As, S, Si, In, Ti, Ga, and P. The switching pattern 130 may further include a thermal stabilization element in addition to the compound. The thermal stabilization element may include at least one of C, N, and O. For example, the switching pattern 130 may include at least one of a binary compound (e.g., GeSe, GeS, AsSe, AsTe, AsS SiTe, SiSe, SiS, GeAs, SiAs, SnSe, or SnTe), a ternary compound (e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe), a quaternary compound (e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn), a quinary compound (e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn), or a senary compound (e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn).

The switching pattern 130 may include a single layer including one of the materials described above. Alternatively, the switching pattern 130 may include a plurality of layers, and the plurality of layers may include different materials of the materials described above. In addition, the switching pattern 130 may further include at least one of B, C, N, or O.

The lower barrier electrode 140 may be disposed between the intermediate electrode ME and the switching pattern 130. The lower barrier electrode 140 may prevent or minimize heat transfer between the intermediate electrode ME and the switching pattern 130. The lower barrier electrode 140 is a multi-layered structure of electrode layers distinguished from each by a difference in their respective densities, and may also have different resistivities and/or surface roughnesses. In some examples, the lower barrier electrode 140 includes a first layer of barrier material and a second layer of barrier material respectively referred to hereinafter as a first lower barrier electrode 142 (or first lower barrier electrode layer) and a second lower barrier electrode 144 (or second lower barrier electrode layer). The term "layer" especially when specifically used will be generally understood as referring to a monolayer, i.e., a generally homogeneous layer of material.

The first lower barrier electrode 142 may be disposed between the intermediate electrode ME and the switching pattern 130. The first lower barrier electrode 142 may reduce stress between the intermediate electrode ME and the switching pattern 130 and may increase adhesive strength therebetween. In some examples, the first lower barrier electrode 142 is wider than the intermediate electrode ME in the first direction D1 or the second direction D2. The intermediate electrode ME may have a first width WD1, and the first lower barrier electrode 142 may have a second width WD2 greater than the first width WD1. Thus, the first lower barrier electrode 142 may also be disposed between the switching pattern 130 and a portion of the first to third interlayer insulating layers 111, 113 and 115. The first lower barrier electrode 142 may reduce stress between the switching pattern 130 and the portion of the first to third interlayer insulating layers 111, 113 and 115 and may increase adhesive strength therebetween. For example, the first lower barrier electrode 142 is or includes low-density carbon film having a density less than about 2.0 g/cm$^3$, e.g., a density of about 1.73 g/cm$^3$. The first lower barrier electrode 142 may have a resistivity of about 46.5 mΩ·cm and a surface roughness of about 1.0 nm. The first lower barrier electrode 142 may further include an inert gas element (e.g., Ar) of about 1 at % or less. In addition, the first lower barrier electrode 142 may further include carbon nitride.

The second lower barrier electrode 144 may be disposed between the first lower barrier electrode 142 and the switching pattern 130. The density of the second lower barrier electrode 144 may be higher than the density of the first lower barrier electrode 142. For example, the second lower barrier electrode 144 may include high-density carbon film having a density greater than about 2.0 g/cm$^3$, e.g. a density of about 2.34 g/cm$^3$. Here, the term "about" encompasses not only the specification for the density of the material but slight variations therefrom arising from inherent aspects of the process used to form the material to its specifications.

The second lower barrier electrode 144 may minimize or prevent diffusion of elements included in the switching pattern 130. In addition, the second lower barrier electrode 144 may minimize or prevent intermixing of the first lower barrier electrode 142 and the switching pattern 130. A resistivity of the second lower barrier electrode 144 may be less than the resistivity of the first lower barrier electrode 142. A surface roughness of the second lower barrier electrode 144 may be less than the surface roughness of the first lower barrier electrode 142. For example, the second lower barrier electrode 144 may have a resistivity of about 24.8 mΩ·cm and a surface roughness of about 0.4 nm. The second lower barrier electrode 144 may include a larger amount of an inert gas element than the first lower barrier electrode 142. For example, the second lower barrier electrode 144 may further include the inert gas element (e.g., Ar) of about 4 at % or more. The inert gas element may be provided into the second lower barrier electrode 144 through a densification process.

The upper barrier electrode 150 may be disposed on the switching pattern 130. The upper barrier electrode 150 may minimize or prevent heat transfer between the switching pattern 130 and the second conductive line CL2. The upper barrier electrode 150 may be a multi-layered structure including electrode layers distinguished from each other by differences in their respective densities, and may also be distinguished from each other by differences in their resistivities and/or surface roughnesses. The upper barrier electrode 150 may include a smaller amount of an inert gas element (e.g., Ar) than the lower barrier electrode 140. Alternatively, the upper barrier electrode 150 may include a larger amount of the inert gas element than the lower barrier electrode 140. In some examples, the upper barrier electrode 150 includes a first upper barrier electrode 152 and a second upper barrier electrode 154.

The first upper barrier electrode 152 may be disposed between the switching pattern 130 and the second upper barrier electrode 154. The first upper barrier electrode 152 may have a density of about 2.34 g/cm$^3$. Thus, the first upper barrier electrode 152 may be a high-density carbon film. The first upper barrier electrode 152 may minimize or prevent diffusion of the elements included in the switching pattern 130. The first upper barrier electrode 152 may minimize or prevent intermixing of the switching pattern 130 and the second upper barrier electrode 154. For example, the first upper barrier electrode 152 may have a resistivity of about 24.8 mΩ·cm and a surface roughness of about 0.4 nm. The first upper barrier electrode 152 may further include the inert gas element (e.g., Ar) of about 1 at % or less. The inert gas element may be provided into the first upper barrier electrode 152 through a densification process.

The second upper barrier electrode 154 may be disposed between the first upper barrier electrode 152 and the upper electrode 160. The density of the second upper barrier electrode 154 may be less than the density of the first upper barrier electrode 152. For example, the second upper barrier electrode 154 may have a density of about 1.73 g/cm$^3$. Thus, the second upper barrier electrode 154 may be a low-density carbon film. The second upper barrier electrode 154 may reduce stress between the first upper barrier electrode 152 and the upper electrode 160 and may increase adhesive strength therebetween. The second upper barrier electrode 154 may have a resistivity of about 46.5 mΩ·cm and a surface roughness of about 1.0 nm. The second upper barrier electrode 154 may further include a larger amount of the inert gas element than the first upper barrier electrode 152. The second upper barrier electrode 154 may include the inert gas element (e.g., Ar) of about 4 at % or more.

The upper electrode 160 may be disposed on the second upper barrier electrode 154. The upper electrode 160 may electrically connect the second conductive line CL2 to the switching pattern 130. The upper electrode 160 may include at least one of W, Ti, Al, Cu, C, CN, TiN, TiAlN, TiSiN, TiCN, WN, CoSiN, WSiN, TaN, TaCN, TaSiN, and TiO.

A fourth interlayer insulating layer 117 may fill the space between the upper electrodes 160. The fourth interlayer insulating layer 117 may be disposed between the upper insulating layer 119 and the first to third interlayer insulating layers 111, 113 and 115. A top surface of the fourth interlayer insulating layer 117 may be substantially coplanar with a top surface of the upper electrode 160. The fourth interlayer insulating layer 117 may include at least one of silicon oxide, silicon nitride, silicon oxynitride, silicon oxycarbide, silicon oxycarbonitride, and silicon carbonitride. The upper insulating layer 119 and the second conductive line CL2 may be provided on the fourth interlayer insulating layer 117.

Figure 5:
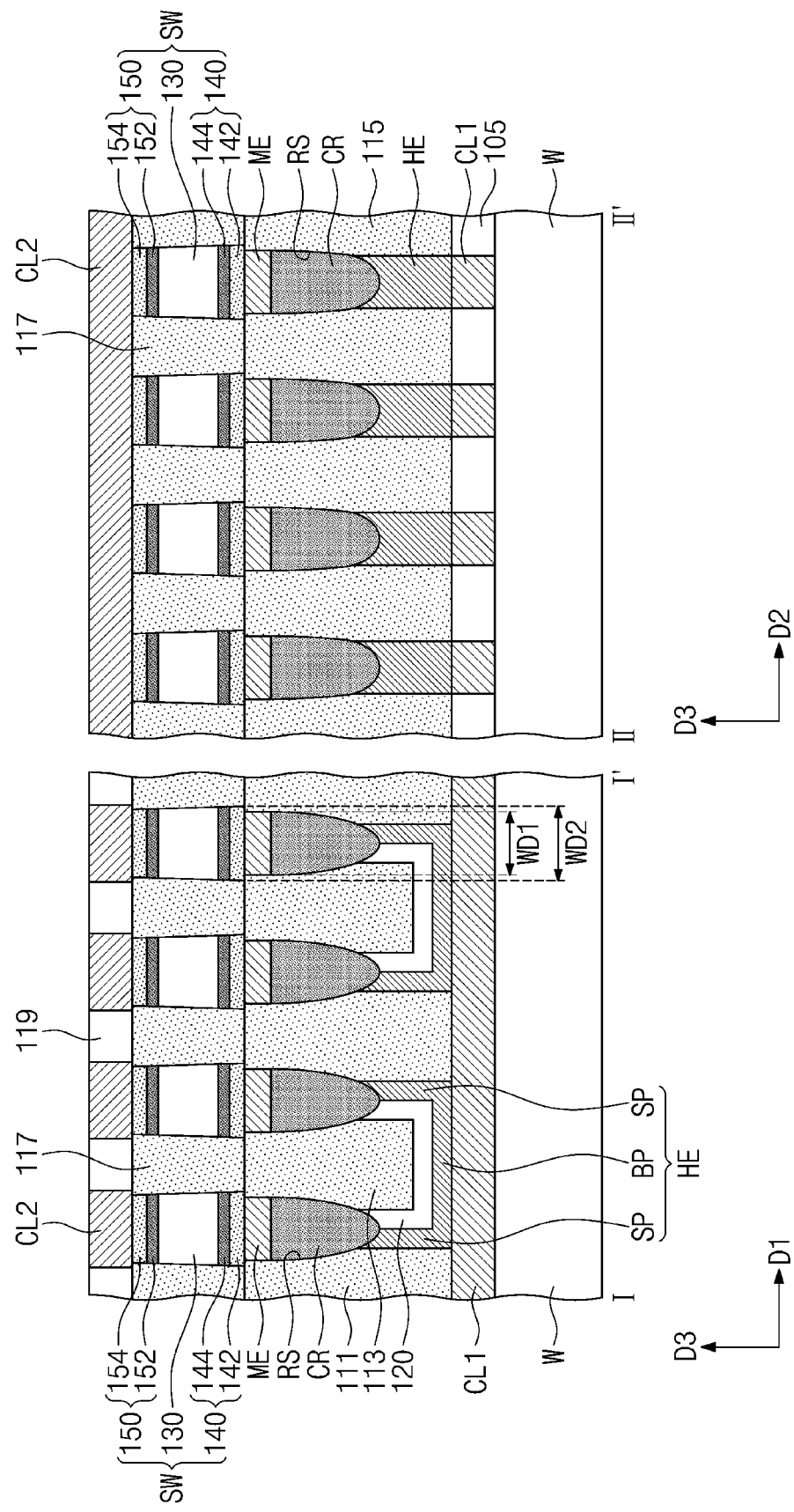
FIG. 5 is a cross-sectional view of another example of a variable resistance memory device according to the inventive concepts taken along the lines I-I' and II-II' of FIG. 3.

FIG. 5 is a cross-sectional view taken along lines I-I' and II-II' of FIG. 3 and together with FIG. 2 illustrate another example of a variable resistance memory device according to the inventive concepts. Hereinafter, for the sake of brevity components which are the same as those in the above examples, as designated by like reference numerals, will not be described again in detail.

In the example illustrated in FIG. 5, there is no upper electrode. The density of the second upper barrier electrode layer 154 may be higher than the density of the first upper barrier electrode layer 152. A surface roughness of the second upper barrier electrode layer 154 may be less than a surface roughness of the first upper barrier electrode layer 152. The first upper barrier electrode layer 152 may be a layer of low-density carbon, and the second upper barrier electrode 154 may be a layer of high-density carbon.

Figure 6:
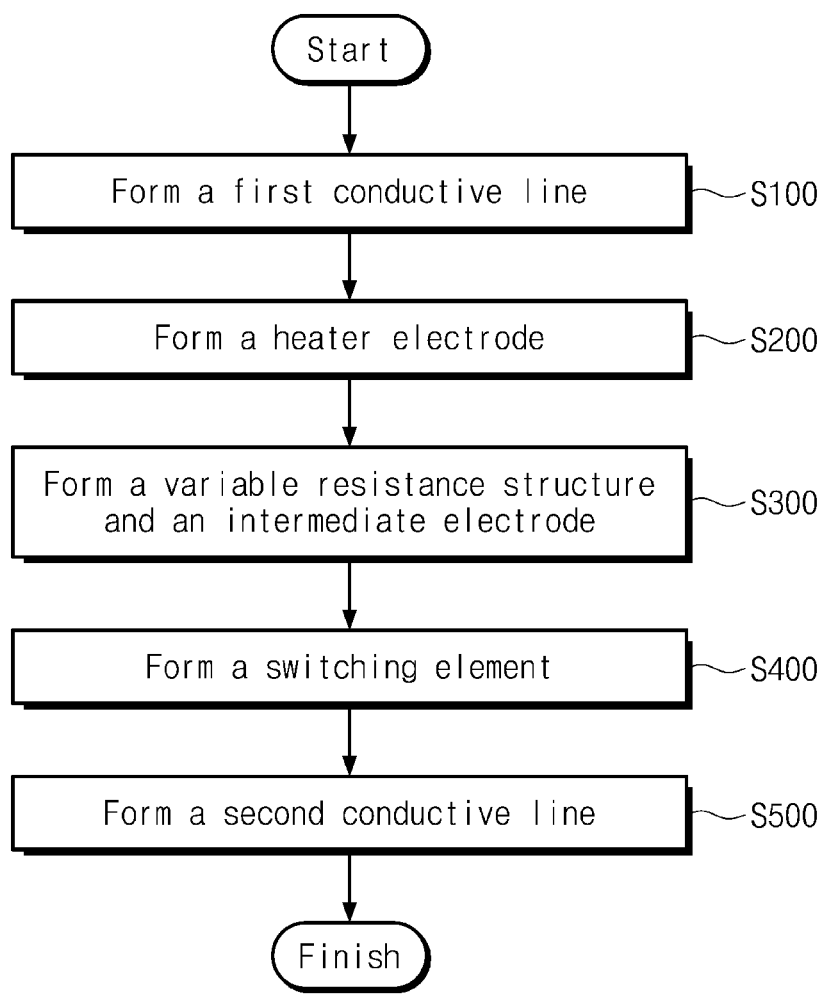
FIG. 6 is a flowchart of an example of a method of manufacturing a variable resistance memory device of FIG. 3, according to the inventive concepts.

FIG. 6 is a flowchart illustrating a method of manufacturing the variable resistance memory device 100 of FIG. 3.

Referring to FIG. 6, a method of manufacturing the variable resistance memory device 100 according to the inventive concepts may include forming a first conductive line CL1 (S100), forming a heater electrode HE (S200), forming a variable resistance structure CR and an intermediate electrode ME (S300), forming a switching element SW (S400), and forming a second conductive line CL2 (S500).

FIGS. 7 to 15 are cross-sectional views taken in the direction of lines I-I' and II-II' of FIG. 3 to illustrate an example of the method of manufacturing the variable resistance memory device of FIG. 3.

Figure 7:
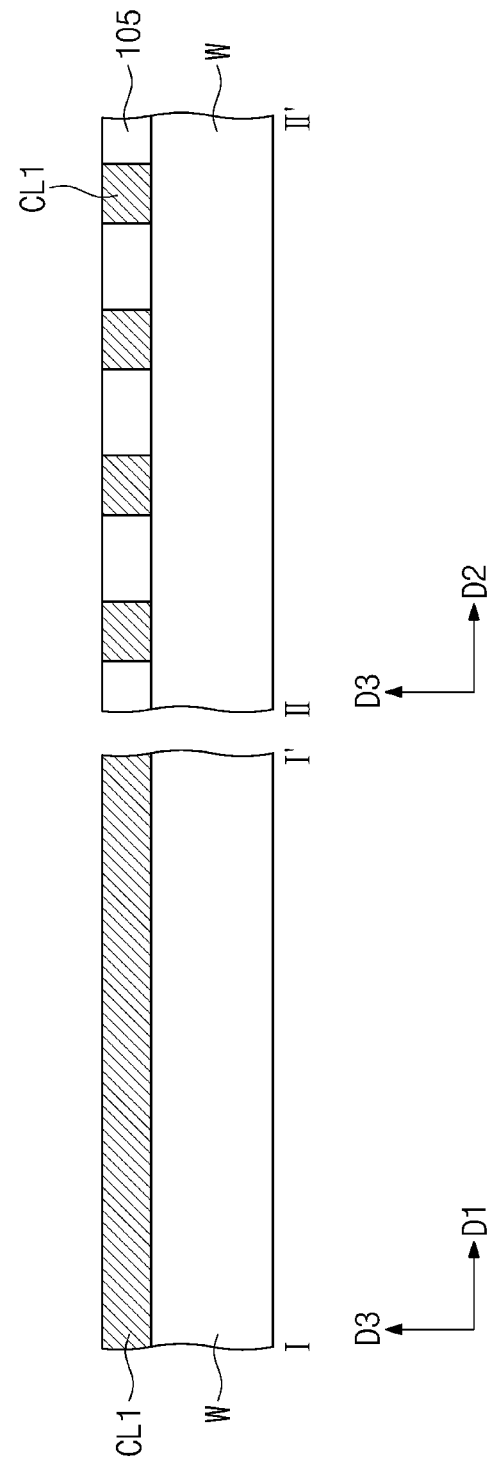
FIGS. 7, 8, 9, 10, 11, 12, 13, 14 and 15 are cross-sectional views of a variable resistance memory device during the course of its manufacture, taken in directions corresponding to the directions of lines I-I' and II-II' of FIG. 3.

Referring to FIGS. 6 and 7, the first conductive line CL1 are formed on a substrate W (S100). In some examples, the first conductive lines CL1 are formed by a deposition process of forming a metal layer, a photolithography process, and an etching process. Thereafter, a lower insulating layer 105 is formed between the first conductive lines CL1. In certain examples, the first conductive lines CL1 are formed by a damascene method. More specifically, the lower insulating layer 105 having lower trenches may be formed on the substrate W, and then, the first conductive lines CL1 may be formed in the lower trenches by a deposition process of forming a blanket metal layer filling the lower trench and a chemical mechanical polishing (CMP) process of planarizing the metal layer.

Figure 8:
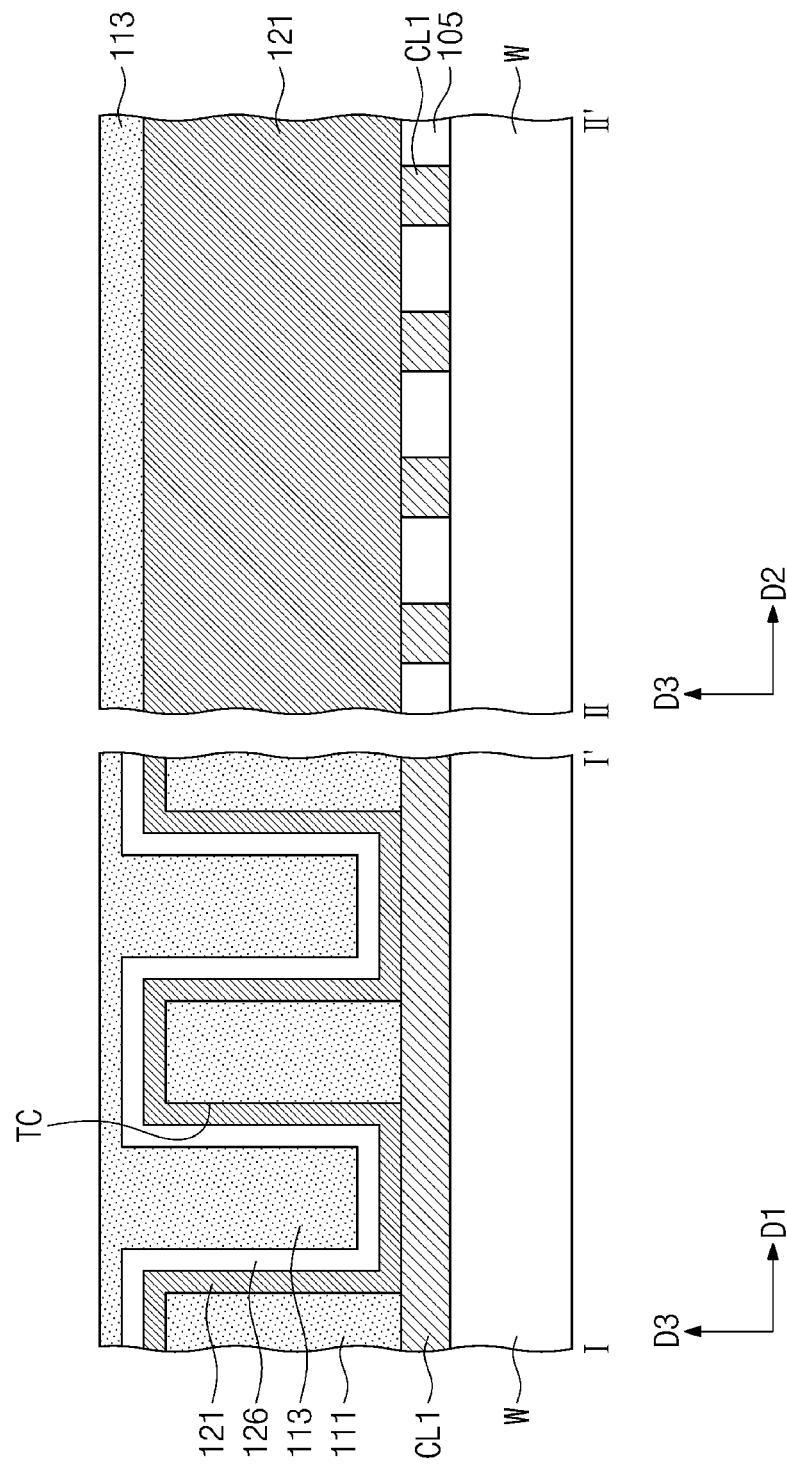
Figure 9:
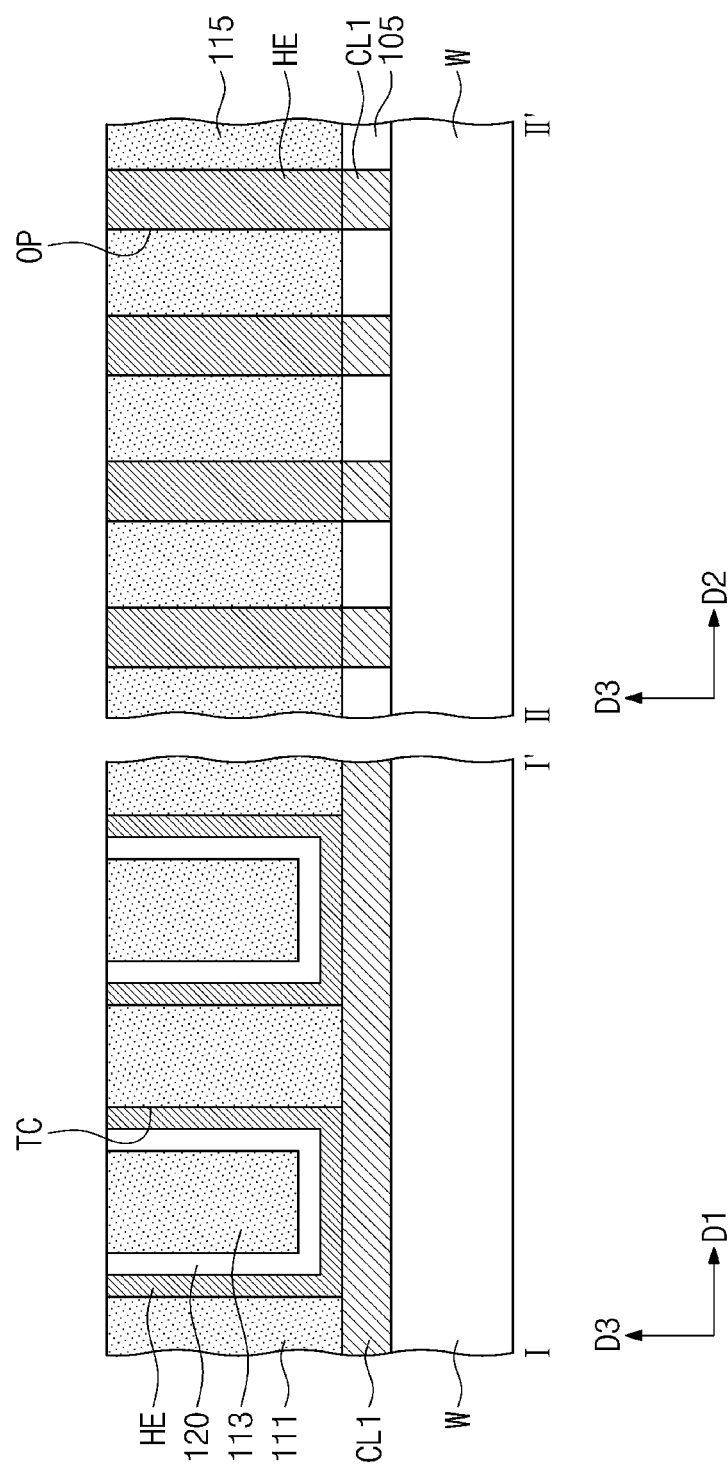

Referring to FIGS. 6, 8 and 9, the heater electrodes HE are formed on the first conductive lines CL1 (S200). In some examples, the forming of the heater electrodes HE includes forming the first to third interlayer insulating layers 111, 113 and 115.

Referring to FIG. 8, an example of forming a heater electrode HE on one of the first conductive lines CL1 will be described. Note, too, in the description that follows, the forming of only one element or feature may be described at times for simplicity although the method may entail the forming of multiple ones of the elements or features at once as will be clear from the figures.

The first interlayer insulating layer 111 may be formed on the first conductive line CL1 and the lower insulating layer 105. The first interlayer insulating layer 111 may be formed of silicon nitride or silicon oxynitride. An upper trench TC may be formed in the first interlayer insulating layer 111. The forming of the upper trench TC may include an anisotropic etching process. The upper trench TC may intersect the first conductive line CL1. Next, an electrode layer 121 and a spacer layer 126 may be sequentially formed on the first interlayer insulating layer 111 having the upper trench TC. The electrode layer 121 and the spacer layer 126 may be conformally formed along surfaces defining the upper trench TC. The electrode layer 121 may include a layer of W, Ti, Al, Cu, C, CN, TiN, TiAlN, TiSiN, TiCN, WN, CoSiN, WSiN, TaN, TaCN, TaSiN, or TiO. The spacer layer 126 may include at least one of silicon oxide and silicon oxynitride. The second interlayer insulating layer 113 may be formed on the spacer layer 126 to fill the remainder of the upper trench TC. The second interlayer insulating layer 113 may be formed of the same material as the first interlayer insulating layer 111.

Referring to FIG. 9, the second interlayer insulating layer 113, the spacer layer 126, and the electrode layer 121 may be planarized until the first interlayer insulating layer 111 is exposed. Subsequently, portions of the first and second interlayer insulating layers 111 and 113, the spacer layer 126 and the electrode layer 121, which do not overlap the first conductive line CL1, may be etched to form an opening OP. As a result, the heater electrode HE may be formed from the electrode layer 121 and a spacer pattern 120 may be formed from the spacer layer 126.

A plurality of the heater electrodes HE may be formed and may be spaced apart from each other in the first direction D1 and the second direction D2. Thereafter, the third interlayer insulating layer 115 may be formed to fill the opening OP. The third interlayer insulating layer 115 may be formed of the same material as the first interlayer insulating layer 111. The forming of the third interlayer insulating layer 115 may include a deposition process of forming a dielectric and a CMP process.

Referring to FIGS. 6 and 10 to 12, the variable resistance structure CR and the intermediate electrode ME may be formed on the heater electrode HE (S300). In some examples, the variable resistance structure CR and the intermediate electrode ME may be formed by a damascene method.

Figure 10:
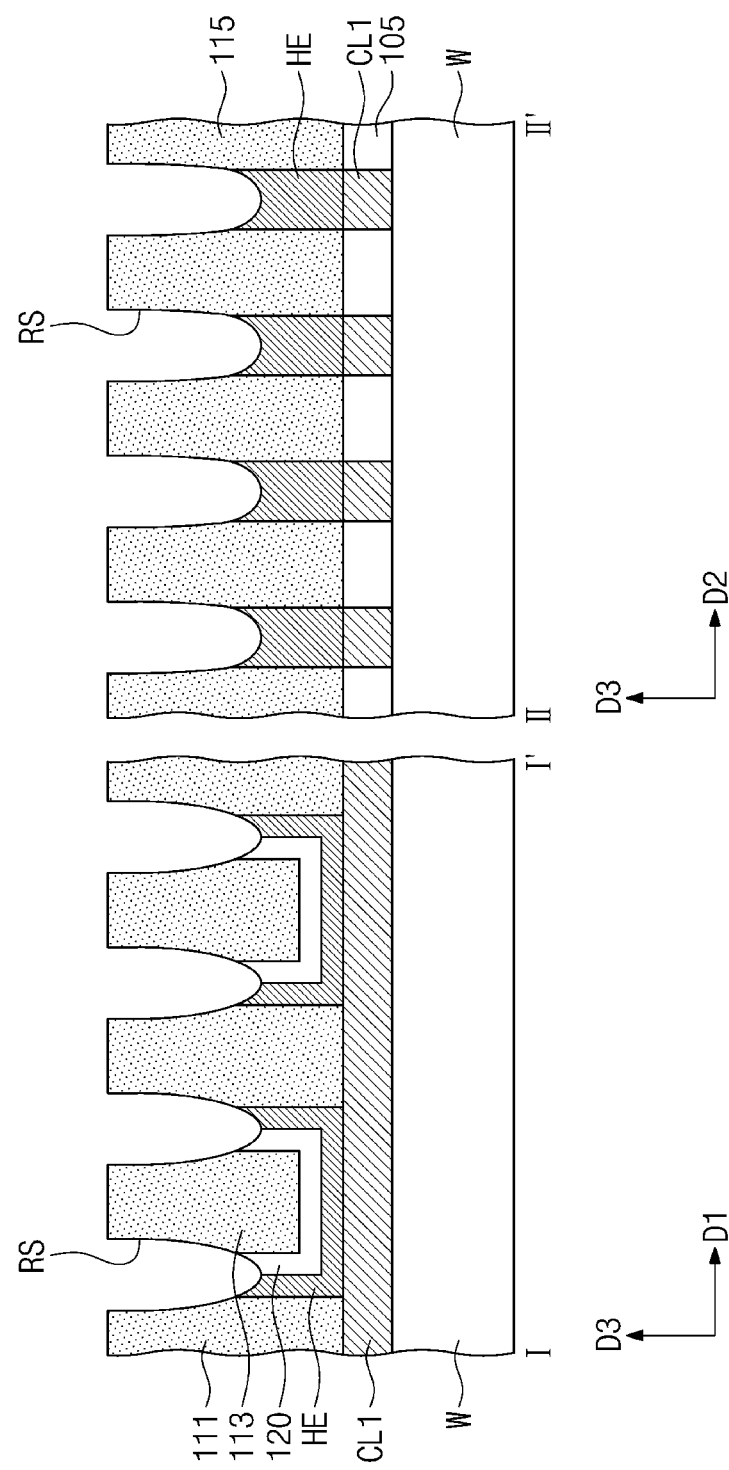

Referring to FIG. 10, a recess RS may be formed to expose the heater electrode HE. The forming of the recess RS may include a process of etching an upper portion of the spacer pattern 120 and a process of etching an upper portion of the heater electrode HE. Each of the processes of etching the spacer pattern 120 and the heater electrode HE may be a wet etching process. Thereafter, an isotropic wet etching process may be performed to expand the space formed by etching the upper portion of the heater electrode HE and the upper portion of the spacer pattern 120. For example, the isotropic wet etching process may be performed using an etchant including phosphoric acid.

Figure 11:
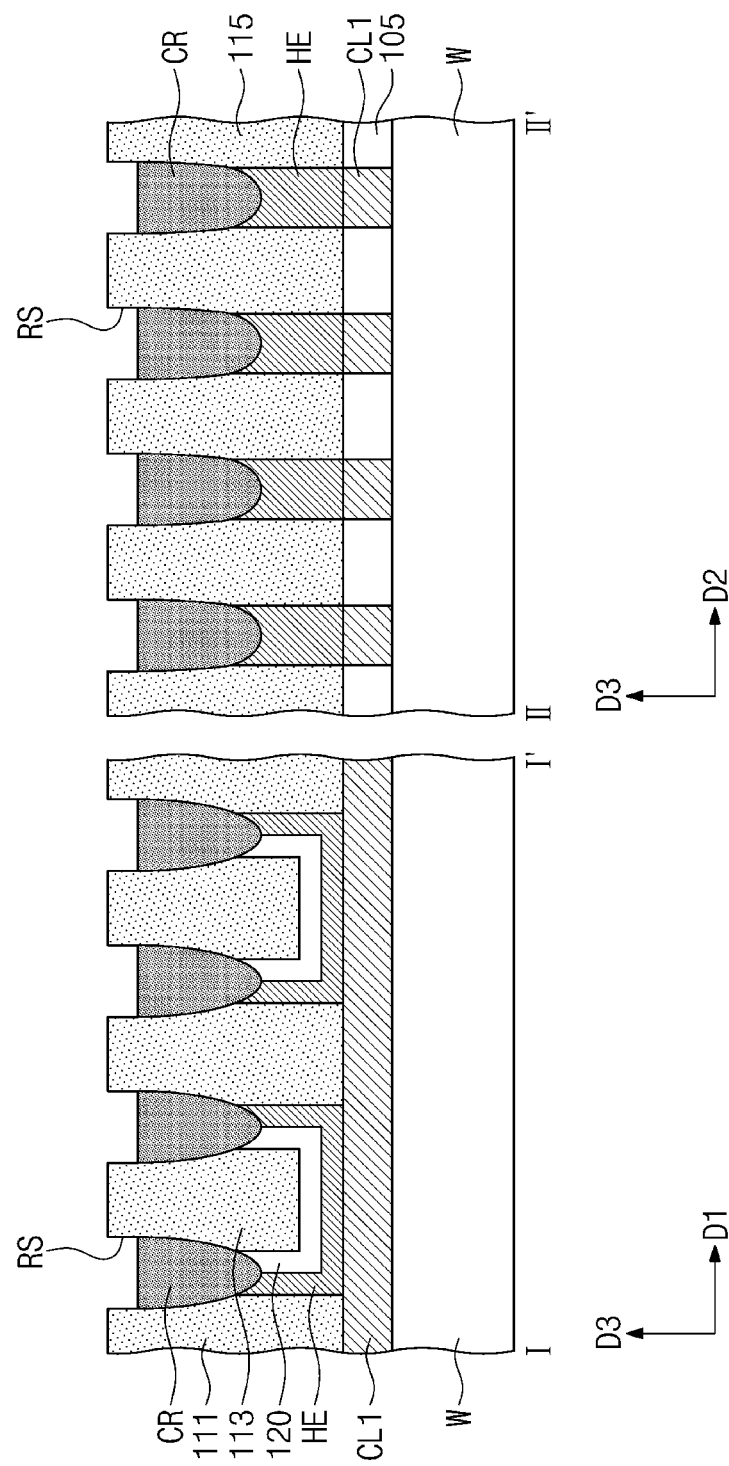

Referring to FIG. 11, the variable resistance structure CR is formed in the recess RS. In some examples, a variable resistance layer is formed to fill the recess RS, and then, an upper portion of the variable resistance layer is etched to form the variable resistance structure CR. For example, the variable resistance layer may include at least one of a binary compound (e.g., GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb), a ternary compound (e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS), a quaternary compound (e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS), or a quinary compound (e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, or GeSbSeZnSn). The variable resistance layer may be formed by a physical vapor deposition (PVD) method or a chemical vapor deposition (CVD) method. In addition, the variable resistance layer may further include impurities including at least one of B, C, N, O, P, Ca, W, Ti, Hf, or Zr.

Figure 12:
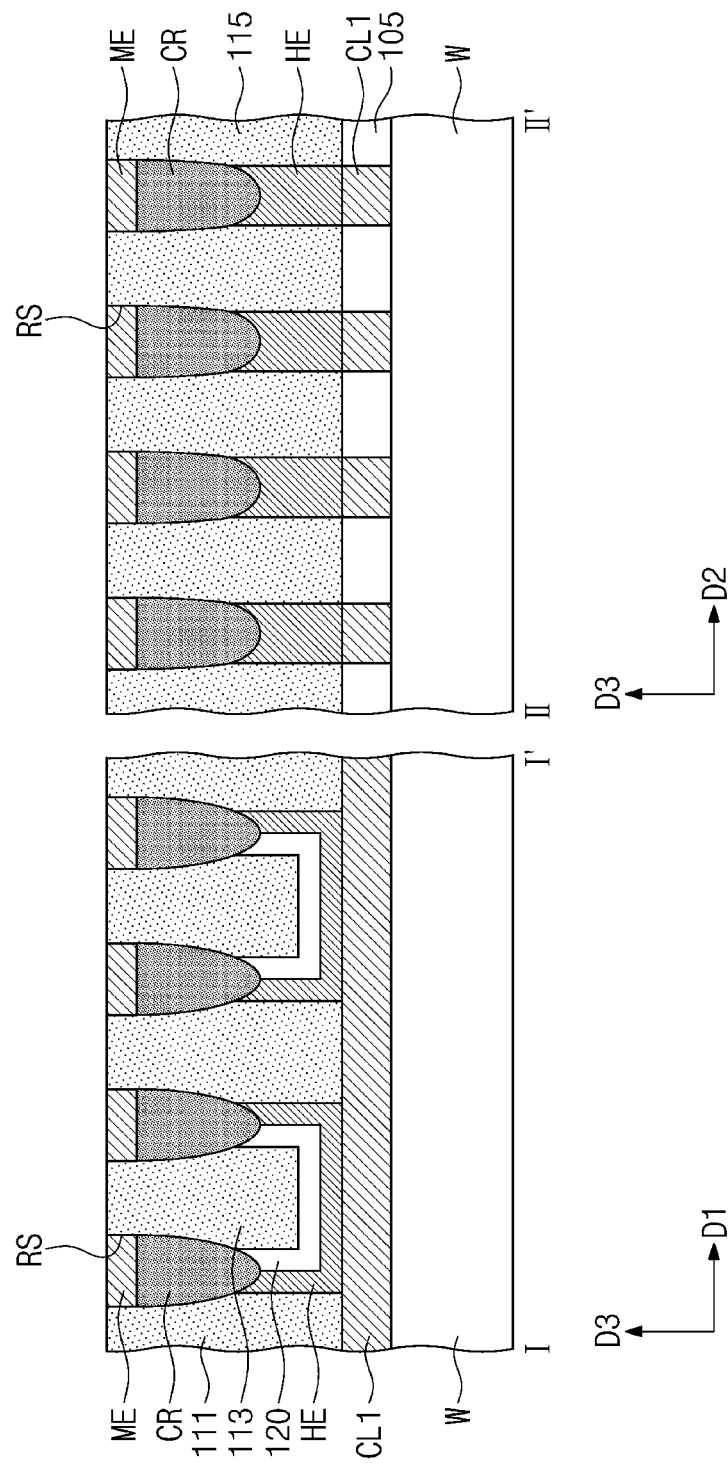

Referring to FIG. 12, an intermediate electrode ME is formed in an upper portion of the recess RS. The intermediate electrode ME may be formed of at least one layer of material selected from the group consisting of W, Ti, Al, Cu, C, CN, TiN, TiAlN, TiSiN, TiCN, WN, CoSiN, WSiN, TaN, TaCN, and TaSiN. In some examples, an electrode layer(s) is formed on the resultant structure having the variable resistance structure CR, and then, the electrode layer(s) is planarized to form the intermediate electrode ME. Alternatively, the process of forming the intermediate electrode ME may be omitted.

Figure 13:
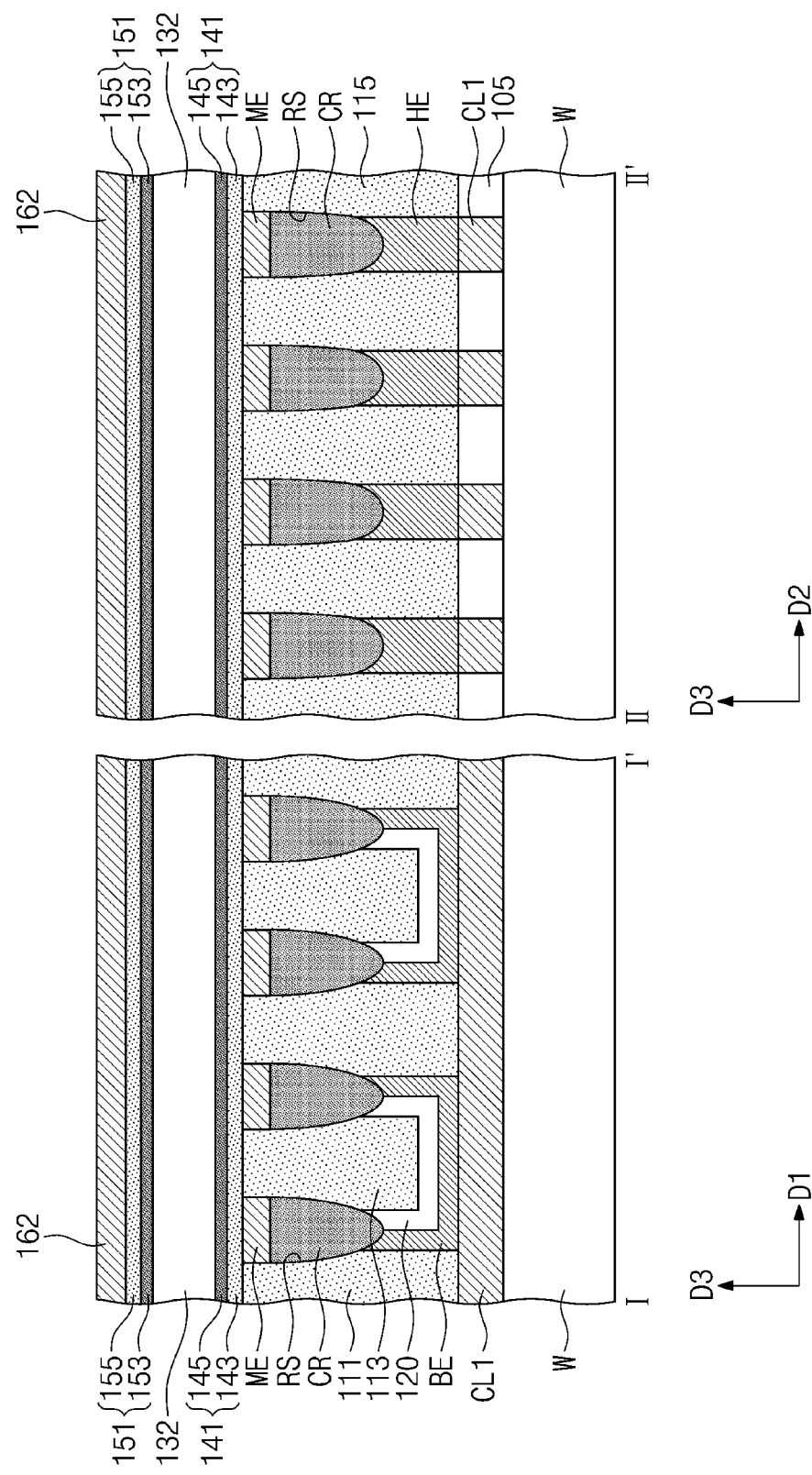
Figure 14:
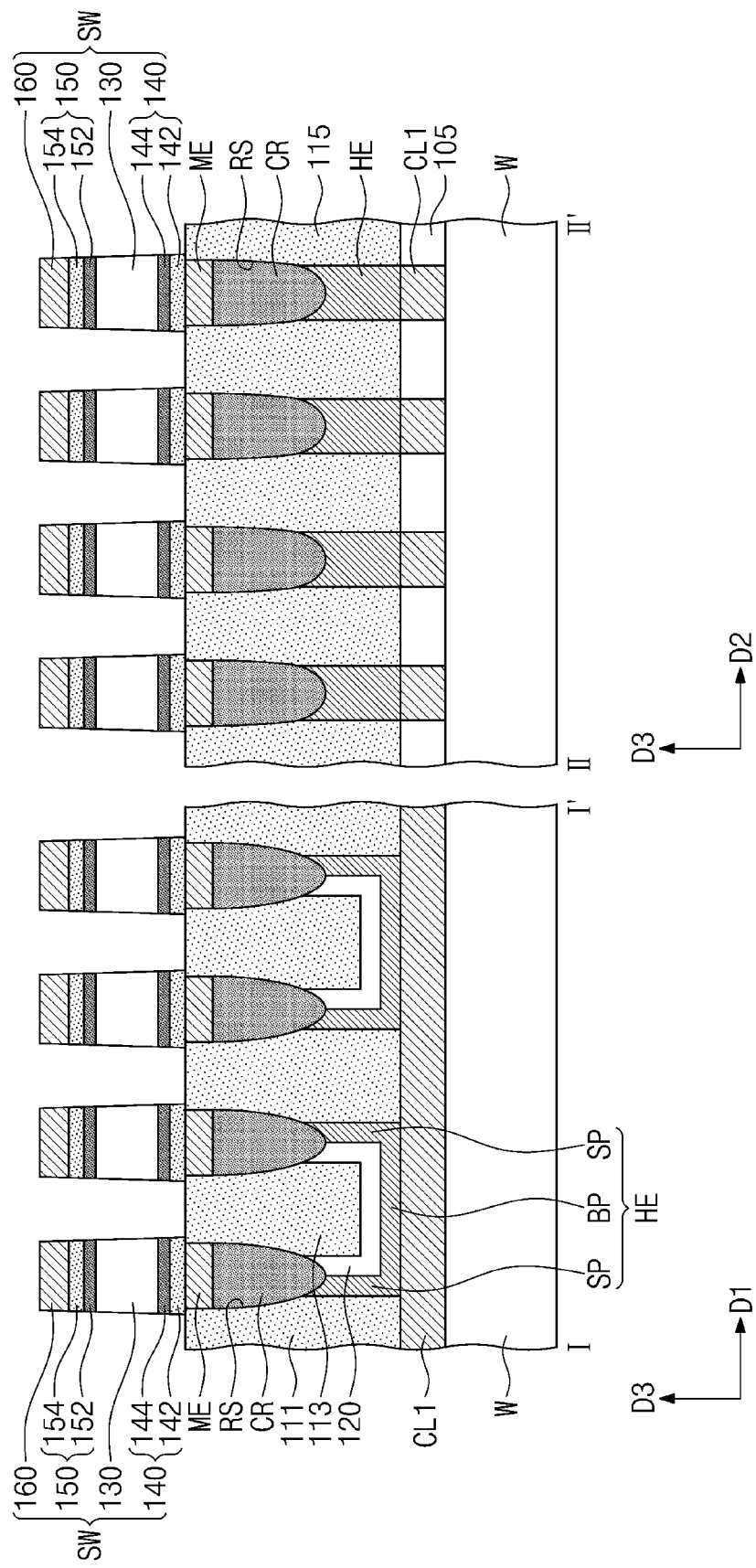

Referring to FIGS. 6, 13 and 14, the switching element SW is formed on the resultant structure, e.g., the structure having the intermediate electrode ME (S400). The switching element SW may be formed by a thin layer deposition process, a photolithography process, and an etching process.

Figure 16:
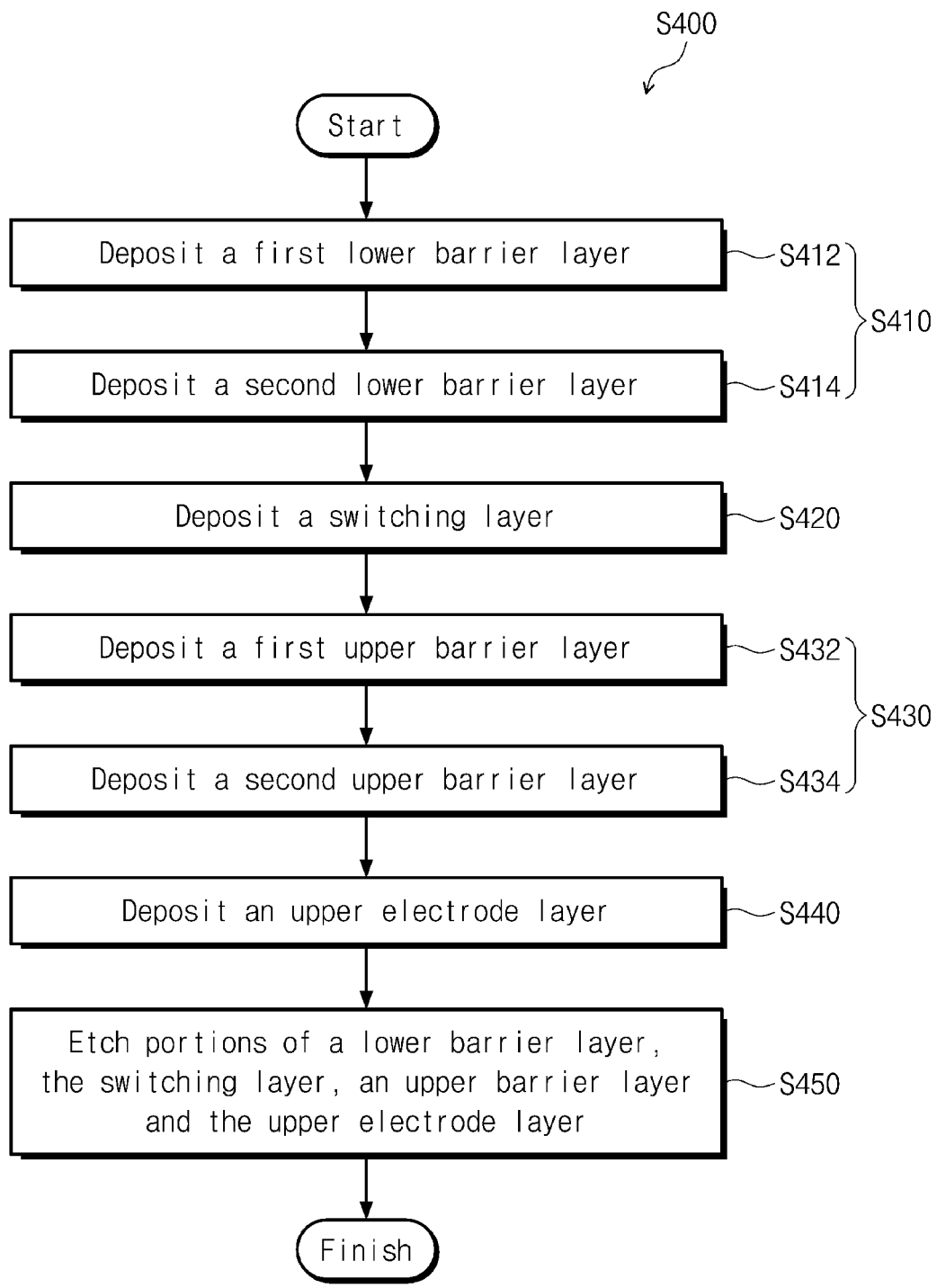
FIG. 16 is a flowchart of an example of an operation of forming a switching element in the method illustrated by the flowchart of FIG. 6.

FIG. 16 is a flowchart illustrating an example of the operation S400 of forming the switching element SW in the method of FIG. 6.

Referring to FIG. 16, an example of the operation S400 of forming the switching element SW includes forming a lower barrier layer 141 (S410), depositing a switching layer 132 (S420), forming an upper barrier layer 151 (S430), depositing an upper electrode layer 162 (S440), and etching portions of the lower barrier layer 141, the switching layer 132, the upper barrier layer 151 and the upper electrode layer 162.

Figure 17:
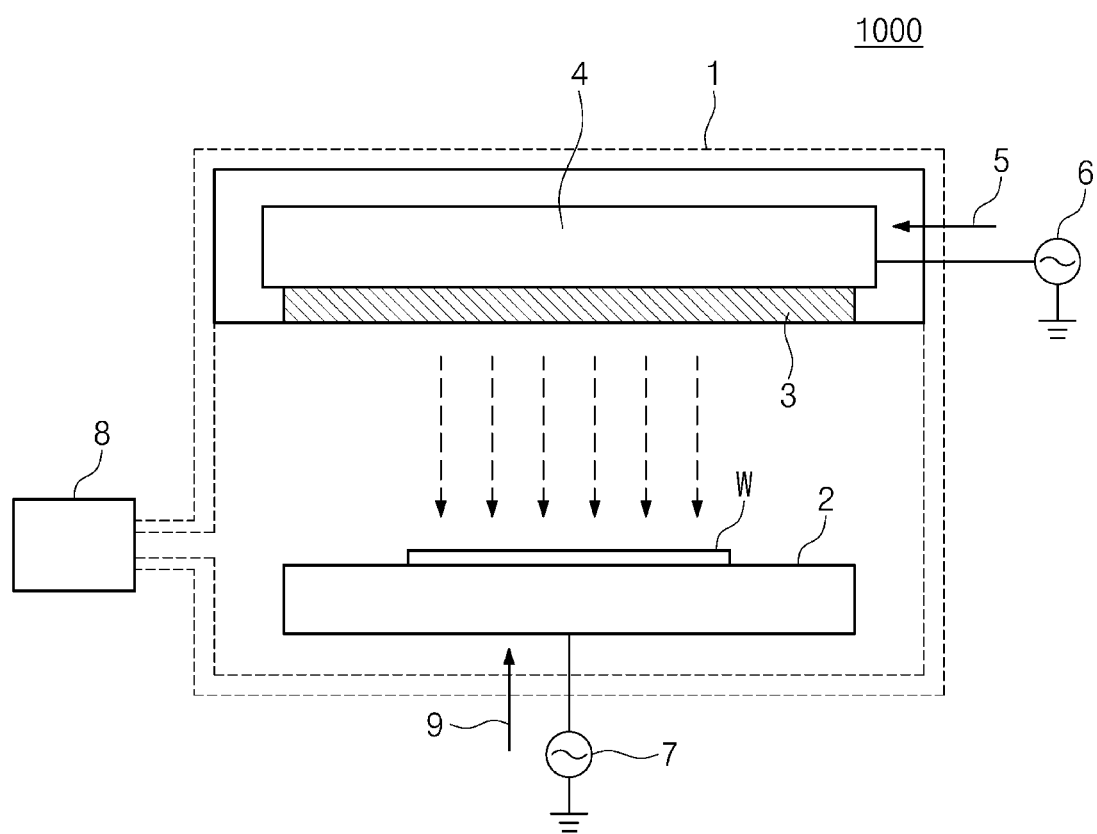
FIG. 17 is a schematic diagram of a thin layer deposition apparatus for forming a lower barrier layer and an upper barrier layer in the stage of the method shown in FIG. 13.

FIG. 17 illustrates a thin layer deposition apparatus 1000 for forming the lower barrier layer 141 and the upper barrier layer 151 of FIG. 13.

Referring to FIG. 17, the thin layer deposition apparatus 1000 is a sputtering apparatus. For example, the thin layer deposition apparatus 1000 may include a chamber 1, a heater chuck 2, a target 3, a magnetron 4, first and second power supply units 6 and 7, and a gas supply unit 8. The gas supply unit 8 provides a process gas into the chamber 1. The process gas may include argon (Ar), nitrogen ($N_2$), or krypton (Kr). The heater chuck 2 may be disposed in a lower portion of the chamber 1, and the magnetron 4 may be disposed in an upper portion of the chamber 1. The substrate W may be provided on the heater chuck 2. The target 3 may be fixed on a bottom surface of the magnetron 4. The target 3 may include a carbon target, a compound target, or a metal target. The compound target may include a compound that includes at least one of Te and Se (i.e., one or more chalcogenide elements) and at least one material selected from the group consisting of Ge, Sb, Bi, Al, Pb, Sn, Ag, As, S, Si, In, Ti, Ga, and P. The metal target may include titanium or titanium nitride. The first power supply unit 6 may provide first radio-frequency power 5 (e.g., source power) to the magnetron 4. The first radio-frequency power 5 excites the process gas to induce plasma in the chamber 1. The first radio-frequency power 5 may accelerate the plasma toward the target 3 to generate target particles. The target particles may be deposited as a thin layer on the substrate W. The second power supply unit 7 may provide second radio-frequency power 9 (e.g., bias power) to the heater chuck 2. The second radio-frequency power 9 may accelerate the target particles and the plasma toward the substrate W to increase the density of the thin layer.

Referring to FIGS. 13, 16 and 17, the thin layer deposition apparatus 1000 may form the lower barrier layer 141 by using the target 3 which is the carbon target (S410). The lower barrier layer 141 may be formed by a sputtering method. In some examples, the lower barrier layer 141 is formed by forming a first lower barrier layer 143 (S412) and forming a second lower barrier layer 145 (S414).

For example, the first power supply unit 6 may supply the first radio-frequency power 5 to the magnetron 4 to form the first lower barrier layer 143 on the substrate W (S412). The heater chuck 2 may heat the substrate W to a high temperature of about 350 degrees Celsius. The gas supply unit 8 may provide the argon gas as the process gas over the substrate W. The first lower barrier layer 143 may include low-density carbon. The first lower barrier layer 143 may further include an inert gas element (e.g., Ar) of about 1 at % or less. In addition, the first lower barrier layer 143 may further include carbon nitride.

Next, the first and second power supply units 6 and 7 may supply the first and second radio-frequency powers 5 and 9 to the magnetron 4 and the heater chuck 2, respectively, to form the second lower barrier layer 145 on the substrate W (S414). The heater chuck 2 may heat the substrate W to a low temperature of about 150 degrees Celsius. The gas supply unit 8 may provide the nitrogen gas or the krypton gas as the process gas over the substrate W. The second lower barrier layer 145 is formed on the first lower barrier layer 143. The second lower barrier layer 145 may be formed to be denser than the first lower barrier layer 143, through a densification process. The second lower barrier layer 145 may include high-density carbon. In an example, the second lower barrier layer 145 includes high-density carbon doped with nitrogen (N). The second lower barrier layer 145 may include an inert gas element (e.g., Ar) of about 4 at % or more.

Next, the switching layer 132 may be formed by a sputtering method (S420). The switching layer 132 may be formed of a compound that includes at least one of Te or Se (i.e., one or more chalcogenide elements) and at least one material selected from the group consisting of Ge, Sb, Bi, Al, Pb, Sn, Ag, As, S, Si, In, Ti, Ga, and P. The switching layer 132 may further include a thermal stabilization element in addition to the compound. The thermal stabilization element may include at least one of B, C, N, or O. For example, the switching layer 132 may include at least one of a binary compound (e.g., GeSe, GeS, AsSe, AsTe, AsS, SiTe, SiSe, SiS, GeAs, SiAs, SnSe, or SnTe), a ternary compound (e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe), a quaternary compound (e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn), a quinary compound (e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn), or a senary compound (e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAs-SeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn).

Thereafter, the thin layer deposition apparatus 1000 may form the upper barrier layer 151 by using the target 3 which is the carbon target (S430). The upper barrier layer 151 may be formed by a sputtering method. In some examples, the upper barrier layer 151 is formed by forming a first upper barrier layer 153 (S432) and forming a second upper barrier layer 155 (S434).

Referring to FIGS. 13, 16 and 17, the first and second power supply units 6 and 7 may supply the first and second radio-frequency powers 5 and 9 to the magnetron 4 and the heater chuck 2, respectively, to form the first upper barrier layer 153 on the substrate W (S432). The heater chuck 2 may heat the substrate W to a low temperature of about 150 degrees Celsius. The gas supply unit 8 may provide the nitrogen gas or the krypton gas as the process gas over the substrate W. The first upper barrier layer 153 may include high-density carbon. In an example, the first upper barrier layer 153 includes high-density carbon doped with nitrogen (N).

Next, the first power supply unit 6 may supply the first radio-frequency power 5 to the magnetron 4 to form the second upper barrier layer 155 on the substrate W (S434). The heater chuck 2 may heat the substrate W to a high temperature of about 350 degrees Celsius. The gas supply unit 8 may provide the argon gas as the process gas over the substrate W. The second upper barrier layer 155 may include low-density carbon.

Next, the upper electrode layer 162 may be formed by a sputtering method (S440). The upper electrode layer 162 may include at least one material slected from the group consisting of W, Ti, Al, Cu, C, CN, TiN, TiAlN, TiSiN, TiCN, WN, CoSiN, WSiN, TaN, TaCN, TaSiN, and TiO.

Referring to FIGS. 14 and 16, an etching apparatus (not shown) may etch the portions of the lower barrier layer 141, the switching layer 132, the upper barrier layer 151 and the upper electrode layer 162 to form the switching element SW (S450). For example, the portions of the lower barrier layer 141, the switching layer 132, the upper barrier layer 151 and the upper electrode layer 162 may be etched by a reactive ion etching (RIE) method. The switching element SW may include a lower barrier electrode 140, a switching pattern 130, an upper barrier electrode 150, and an upper electrode 160. The upper barrier electrode 150 may include first and second upper barrier electrodes 152 and 154, and the first and second upper barrier electrodes 152 and 154 may be formed from the first and second upper barrier layers 153 and 155, respectively. The lower barrier electrode 140 may include first and second lower barrier electrodes 142 and 144, and the first and second lower barrier electrodes 142 and 144 may be formed from the first and second lower barrier layers 143 and 145, respectively. The first lower barrier layer 143 may increase adhesive strength of the switching element SW with respect to the intermediate electrode ME and/or the first to third interlayer insulating layers 111, 113 and 115. In addition, the first lower barrier layer 143 may minimize or prevent a leaning phenomenon and/or a detachment phenomenon of the switching element SW during the etching process for forming the switching element SW.

Figure 18:
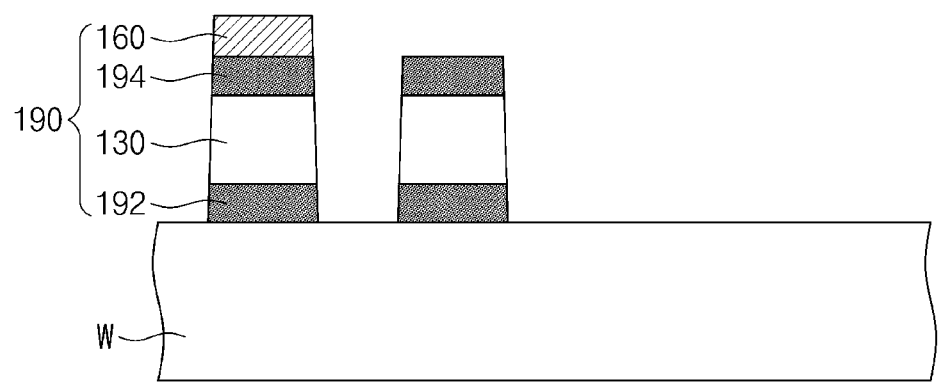
FIG. 18 is a cross-sectional view of a conventional switching element.

FIG. 18 illustrates examples of a conventional switching element 190 formed using an etching process.

Referring to FIG. 18, a typical switching element 190 includes a first barrier electrode 192 and a second barrier electrode 194.

The first barrier electrode 192 is interposed between a substrate W and a switching pattern 130. The first barrier electrode 192 includes high-density carbon. The first barrier electrode 192 reduces or weakens adhesive strength between the substrate W and the switching pattern 130 in an etching process, and thus the conventional switching element 190 may lean and/or be detached. The conventional switching element 190 may even separate from the substrate W.

The second barrier electrode 194 is interposed between the switching pattern 130 and an upper electrode 160. The second barrier electrode 194 includes high-density carbon. The second barrier electrode 194 reduces adhesive strength between the switching pattern 130 and the upper electrode 160 in an etching process to cause detachment of the upper electrode 160. The upper electrode 160 may separate from the second barrier electrode 194.

Referring again to FIG. 14, in contrast to the conventional switching element described above, the upper barrier electrode 150 of a switching element according to the present inventive concepts includes the first and second upper barrier electrodes 152 and 154 formed from the first and second upper barrier layers 153 and 155, respectively. The second upper barrier electrode 154 provides a high degree of adhesive strength between the first upper barrier electrode 152 and the upper electrode 160 during the etching process of forming the first and second upper barrier layers 153 and 155. Thus, detachment of the upper electrode 160 may be minimized or prevented. The upper electrode 160 may be formed from the upper electrode layer 162 through the etching process.

Figure 15:
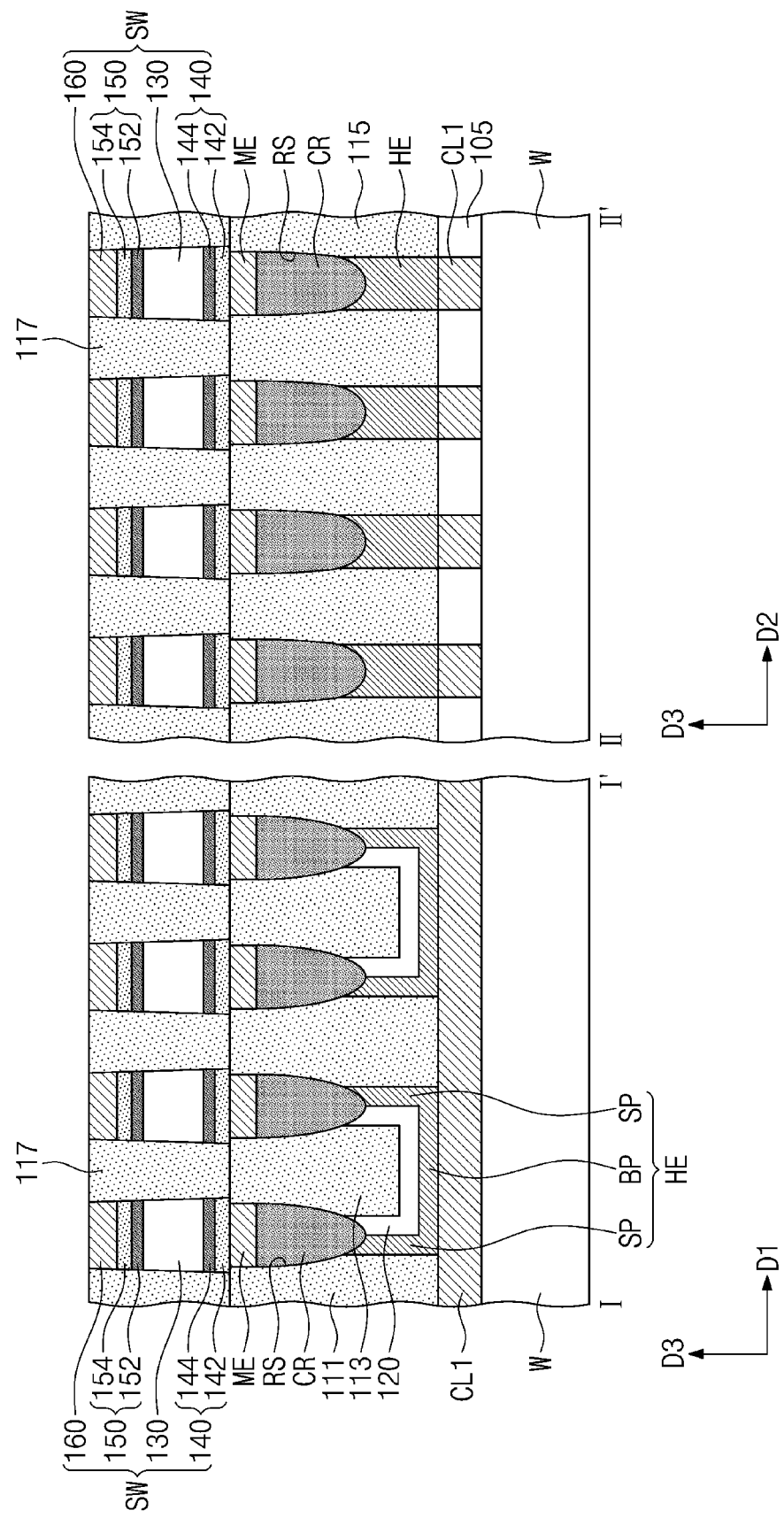

Referring to FIG. 15, a fourth interlayer insulating layer 117 may be formed between the switching elements SW. The fourth interlayer insulating layer 117 may be formed by a deposition process of a dielectric and a CMP process performed on the deposited dielectric.

Referring again to FIGS. 4 and 6, the second conductive line CL2 may be formed on a portion of the fourth interlayer insulating layer 117 and the switching element SW (S500). The second conductive line CL2 may be formed by a deposition process of forming a metal layer, a photolithography process, and an etching process.

Thereafter, an upper insulating layer 119 may be formed between the second conductive lines CL2. The upper insulating layer 119 may be formed by a process of deposition a dielectric and a CMP process performed on the deposited dielectric.

Figure 19:
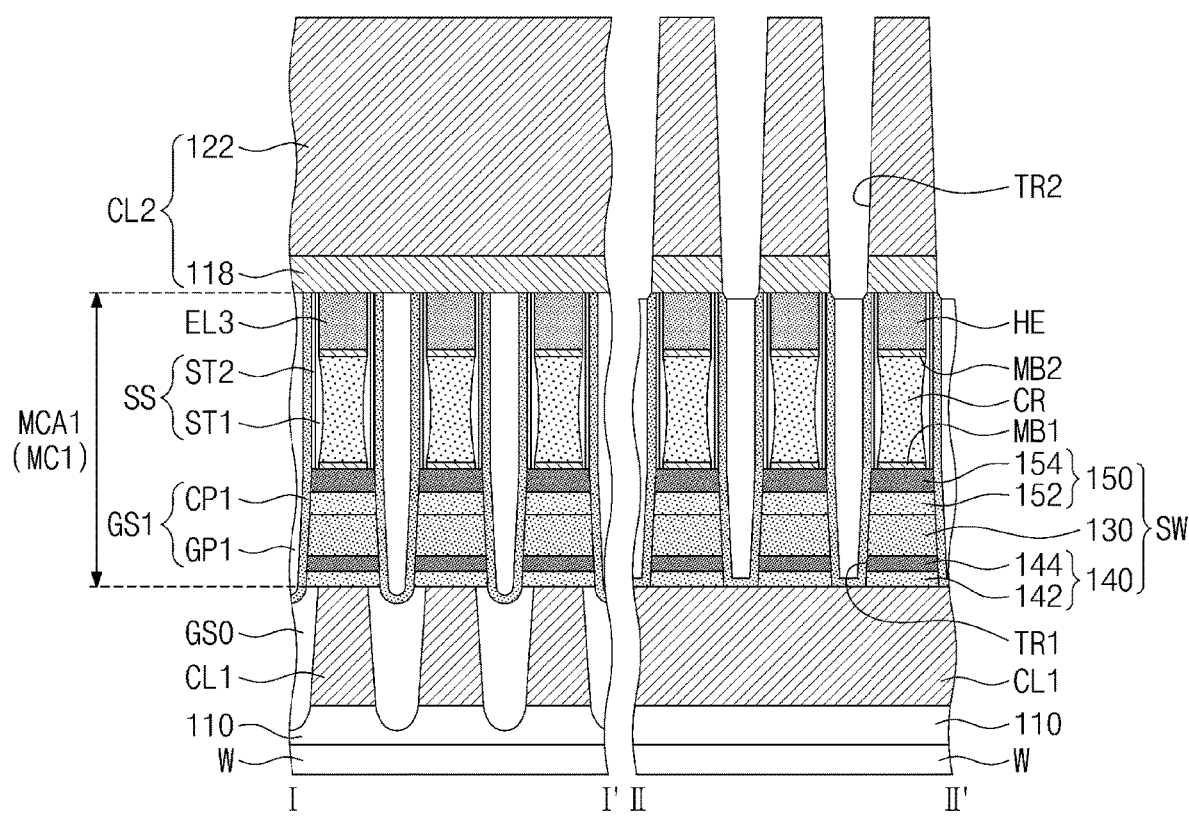
FIG. 19 is a cross-sectional view taken along the lines I-I' and II-II' of FIG. 3.

FIG. 19 is a cross-sectional view taken along the lines I-I' and II-II' of FIG. 3.

Referring to FIGS. 3 and 19, a variable resistance memory device 100 according to the inventive concepts may include a cross-point PRAM array or a three-dimensional (3D) memory array. In some examples, a switching element SW may be disposed under a variable resistance structure CR. Alternatively, the switching element SW may be disposed on the variable resistance structure CR. However, embodiments of the inventive concepts are not limited thereto.

An interlayer insulating layer 110 may be provided between a substrate W and first conductive lines CL1. For example, the interlayer insulating layer 110 may include at least one of a silicon oxide layer, a silicon nitride layer, or a silicon oxynitride layer. Lower filling structures GS0 may fill spaces between the first conductive lines CL1 and may extend in the first direction D1 along the first conductive lines CL1. Each of the lower filling structures GS0 may have a bar or line shape extending in the first direction D1 when viewed in a plan view. For example, the lower filling structures GS0 may include at least one of silicon oxide, silicon nitride, or silicon oxynitride. The lower filling structures GS0 may extend into an upper portion of the interlayer insulating layer 110. In other words, lower portions of the lower filling structures GS0 may be inserted in the upper portion of the interlayer insulating layer 110.

A lower barrier electrode 140 may be disposed between the first conductive line CL1 and a switching pattern 130. In some examples, the lower barrier electrode 140 may include a first lower barrier electrode 142 and a second lower barrier electrode 144. The first lower barrier electrode 142 may include carbon nitride. The second lower barrier electrode 144 may be disposed on the first lower barrier electrode 142. The second lower barrier electrode 144 may include carbon. A density of the second lower barrier electrode 144 may be greater than a density of the first lower barrier electrode 142. The second lower barrier electrode 144 may contain a larger amount of an inert gas element (e.g., Ar) than the first lower barrier electrode 142. The first lower barrier electrode 142 may include the inert gas element of about 1 at % or less. The second lower barrier electrode 144 may include the inert gas element of about 4 at % or more.

The switching pattern 130 may be disposed between the second lower barrier electrode 144 and the variable resistance structure CR. A first metal pattern MB1 may be provided between the switching element SW and the variable resistance structure CR.

An upper barrier electrode 150 may be disposed between the switching pattern 130 and the first metal pattern MB1. The upper barrier electrode 150 may include a first upper barrier electrode 152 and a second upper barrier electrode 154. The first upper barrier electrode 152 may include carbon. The second upper barrier electrode 154 may be disposed on the first upper barrier electrode 152. A density of the second upper barrier electrode 154 may be greater than a density of the first upper barrier electrode 152. For example, the second upper barrier electrode 154 may include high-density carbon, and the first upper barrier electrode 152 may include low-density carbon. The density of the first upper barrier electrode 152 may be about 1.73 g/cm$^3$, and the density of the second upper barrier electrode 154 may be about 2.34 g/cm$^3$. Alternatively, the first upper barrier electrode 152 may include carbon, and the second upper barrier electrode 154 may include carbon nitride. The second upper barrier electrode 154 may be formed through a densification process. The second upper barrier electrode 154 may contain a larger amount of an inert gas element (e.g., Ar) than the first upper barrier electrode 152. For example, the first upper barrier electrode 152 may include the inert gas element of about 1 at % or less. The second upper barrier electrode 154 may include the inert gas element of about 4 at % or more.

Heater electrodes HE may be provided between the variable resistance structures CR and second conductive lines CL2. A second metal pattern MB2 may be provided between the heater electrode HE and the variable resistance structure CR. The variable resistance structure CR may be disposed between the first metal pattern MB1 and the second metal pattern MB2.

The variable resistance structure CR may have recess portions on its sidewalls. The recess portion may be a region in which the sidewall of the variable resistance structure CR is recessed from a sidewall of the first metal pattern MB1 and a sidewall of the second metal pattern MB2.

The first metal pattern MB1 and the second metal pattern MB2 may cover a bottom surface and a top surface of the variable resistance structure CR to prevent diffusion of the material of the variable resistance structure CR. In addition, the first metal pattern MB1 may be provided between the variable resistance structure CR and the switching element SW to reduce a contact resistance therebetween. For example, the first and second metal patterns MB1 and MB2 may include at least one of W, Ti, Al, Cu, C, CN, TiN, TiAlN, TiSiN, TiCN, WN, CoSiN, WSiN, TaN, TaCN, or TaSiN.

A first memory cell MC1 may further include a spacer structure SS. The spacer structure SS may cover the sidewalls of the first metal pattern MB1, the second metal pattern MB2, the variable resistance structure CR and the heater electrode HE. A bottom surface of the spacer structure SS may be in contact with a top surface of the upper barrier electrode 150. The spacer structure SS may include at least one of a silicon oxide layer, a silicon nitride layer, or a silicon oxynitride layer. In some examples, the spacer structure SS may include a first spacer ST1 and a second spacer ST2 which include different materials. The first spacer ST1 may fill the recess portions of the variable resistance structure CR. The second spacer ST2 may cover a sidewall of the first spacer ST1.

The first memory cells MC1 may be two-dimensionally arranged in the first direction D1 and the second direction D2 and may be spaced apart from each other. The first memory cells MC1 may be spaced apart from each other by a first trench TR1, and the first trench TR1 may have a lattice or mesh shape extending in the first direction D1 and the second direction D2.

A first filling structure GS1 may be provided to fill the first trench TR1. The first filling structure GS1 may have a lattice or mesh shape which includes portions extending in the first direction D1 and portions extending in the second direction D2, when viewed in a plan view. The first filling structure GS1 may include a first capping pattern CP1 and a first filling pattern GP1. In some examples, the first capping pattern CP1 may conformally cover sidewalls of the first memory cells MC1. A bottom surface of the first capping pattern CP1 may be in contact with top surfaces of the lower filling structures GS0 and top surfaces of the first conductive lines CL1. Portions of the first capping pattern CP1, which are connected to the top surfaces of the lower filling structures GS0, may extend to a level lower than the top surfaces of the first conductive lines CL1. In other words, lower portions of the first capping pattern CP1 may be inserted in upper portions of the lower filling structures GS0. The first filling pattern GP1 may be provided on the first capping pattern CP1. The first filling pattern GP1 may be spaced apart from the first memory cells MC1 with the first capping pattern CP1 interposed therebetween.

The first capping pattern CP1 may include at least one of SiN, SiO$_2$, SiON, SiBN, SiCN, SiOCN, Al$_2$O$_3$, AlN, or AlON. The first filling pattern GP1 may include at least one of SiN, SiON, SiC, SiCN, SiOC, SiOCN, SiO$_2$, or Al$_2$O$_3$.

A pair of the second conductive lines CL2 may be separated from each other by a second trench TR2. The second conductive line CL2 may include a first barrier pattern 118 and a first line metal pattern 122. The first barrier pattern 118 may include a metal nitride such as TiN, WN, or TaN. The first line metal pattern 122 may include a metal material such as tungsten, titanium, or tantalum. A thickness of the first barrier pattern 118 may range from about 1/20 to about 1/7 of a thickness of the first line metal pattern 122.

Figure 20:
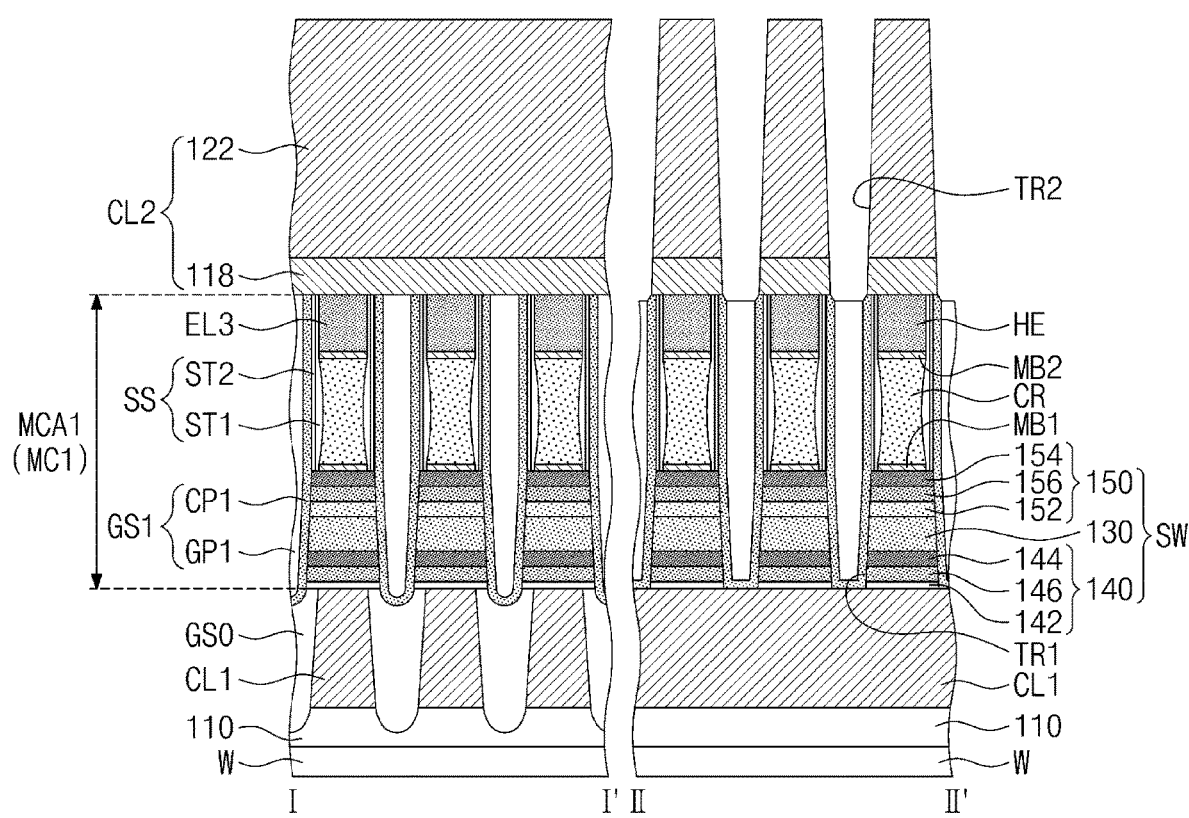
FIG. 20 is a cross-sectional view taken along the lines I-I' and II-II' of FIG. 3.

FIG. 20 is a cross-sectional view taken along the lines I-I' and II-II' of FIG. 3.

Referring to FIG. 20, a lower barrier electrode 140 of the switching element SW may further include a third lower barrier electrode 146, and an upper barrier electrode 150 of the switching element SW may further include a third upper barrier electrode 156.

The third lower barrier electrode 146 may be disposed between the first lower barrier electrode 142 and the second lower barrier electrode 144. The third lower barrier electrode 146 may include carbon. Alternatively, the third lower barrier electrode 146 may include carbon nitride. A density of the third lower barrier electrode 146 may be greater than the density of the first lower barrier electrode 142 and may be less than the density of the second lower barrier electrode 144. When the first lower barrier electrode 142 includes the inert gas element of about 1 at % or less and the second lower barrier electrode 144 includes the inert gas element of about 4 at % or more, the third lower barrier electrode 146 may include the inert gas element (e.g., Ar) of about 2 at % to about 3 at %.

The third upper barrier electrode 156 may be disposed between the first upper barrier electrode 152 and the second upper barrier electrode 154. The third upper barrier electrode 156 may include carbon. Alternatively, the third upper barrier electrode 156 may include carbon nitride. A density of the third upper barrier electrode 156 may be greater than the density of the first upper barrier electrode 152 and may be less than the density of the second upper barrier electrode 154. The third upper barrier electrode 156 may include the inert gas element (e.g., Ar) of about 2 at % to about 3 at %.

The substrate W, the interlayer insulating layer 110, the first conductive line CL1, the switching pattern 130, the variable resistance structure CR, the first and second metal patterns MB1 and MB2, the heater electrode HE, the spacer structure SS, the first filling structure GS1 and the second conductive line CL2 may be substantially the same as described with reference to FIG. 19.

Hereinafter, an arrangement structure of the variable resistance structure CR and the switching element SW in a third direction D3 will be described.

Figure 21:
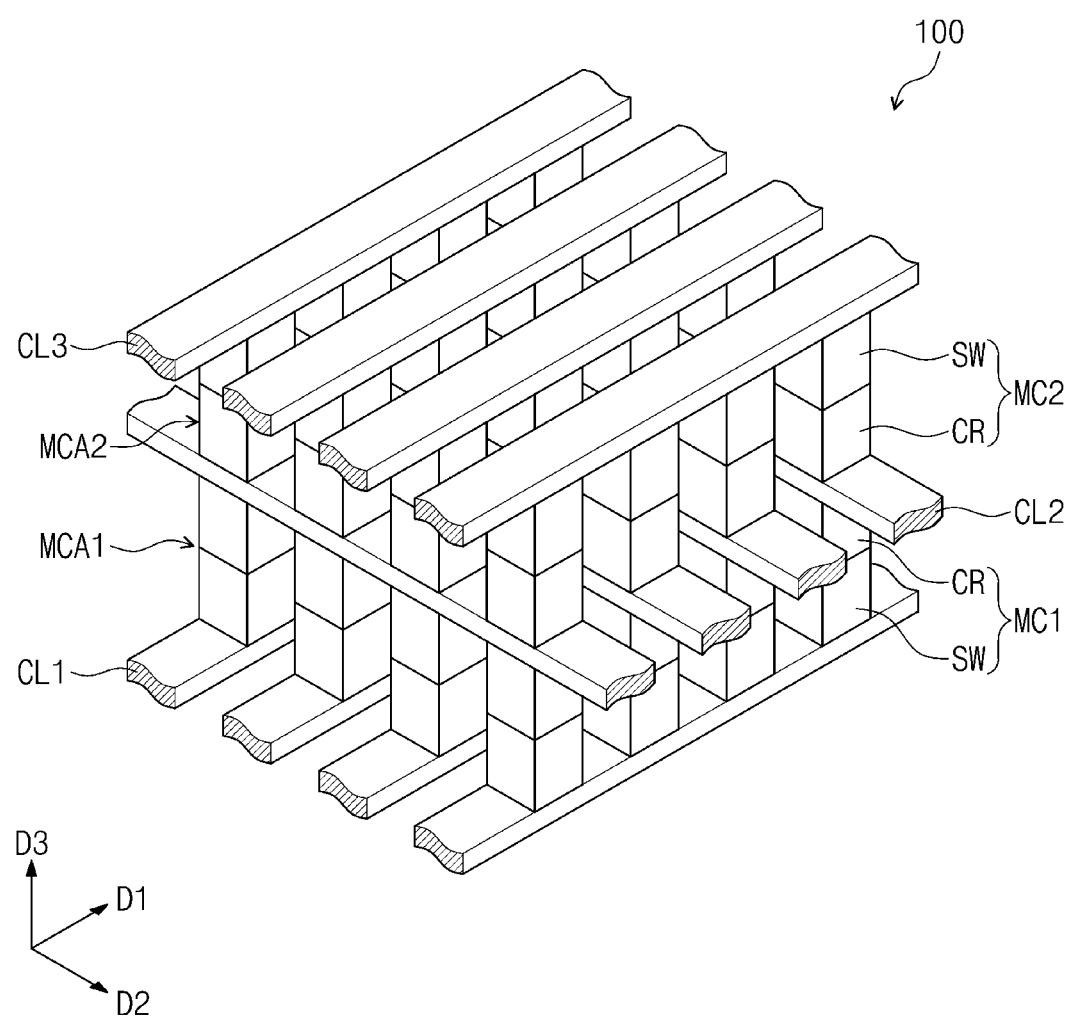
FIG. 21 is a perspective view of an example of a variable resistance memory device according to the inventive concepts.

FIG. 21 is a perspective view of an example of a variable resistance memory device 100 according to the inventive concepts.

Referring to FIG. 21, a first memory cell stack MCA1 of the variable resistance memory device 100 according to the inventive concepts may be connected between first conductive lines CL1 and second conductive lines CL2, and a second memory cell stack MCA2 of the variable resistance memory device 100 may be connected between the second conductive lines CL2 and third conductive lines CL3.

The first conductive lines CL1 may extend in a first direction D1. The second conductive lines CL2 may be disposed above the first conductive lines CL1. The second conductive lines CL2 may extend in a second direction D2. The second direction D2 may intersect the first direction D1. The third conductive lines CL3 may be disposed above the second conductive lines CL2. The third conductive lines CL3 may extend in the first direction D1.

The first memory cell stack MCA1 may include first memory cells MC1 which are provided at intersection points of the first conductive lines CL1 and the second conductive lines CL2, respectively. The first memory cells MC1 may be two-dimensionally arranged to constitute rows and columns. The second memory cell stack MCA2 may include second memory cells MC2 which are provided at intersection points of the second conductive lines CL2 and the third conductive lines CL3, respectively. The second memory cells MC2 may be two-dimensionally arranged to constitute rows and columns.

Each of the first and second memory cells MC1 and MC2 may include the variable resistance structure CR and the switching element SW. The variable resistance structure CR of the first memory cell MC1 may be disposed on the switching element SW of the first memory cell MC1, and the variable resistance structure CR of the second memory cell MC2 may be disposed under the switching element SW of the second memory cell MC2. The second conductive line CL2 may function as a common bit line.

Figure 22:
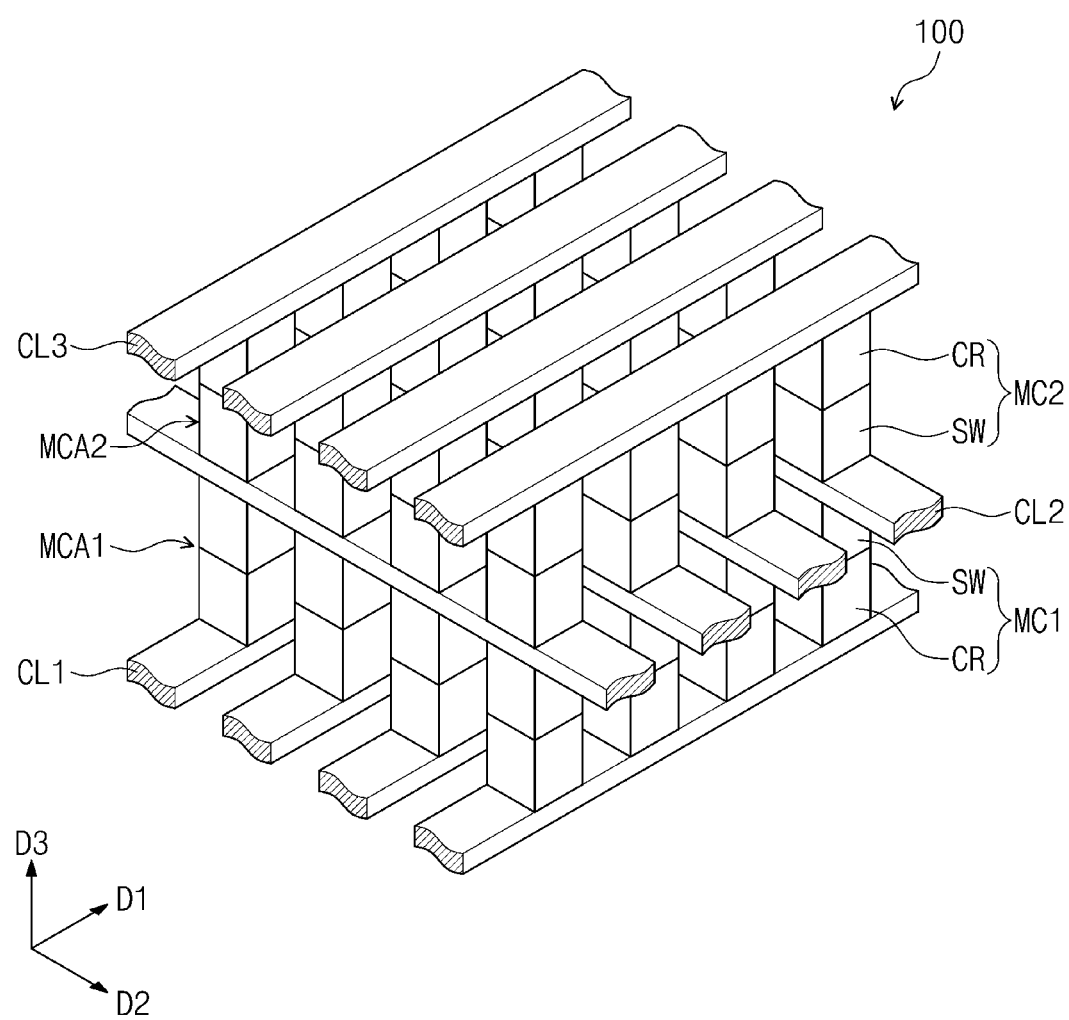
FIG. 22 is a perspective view of an example of a variable resistance memory device according to the inventive concepts.

FIG. 22 is a perspective view of an example of a variable resistance memory device 100 according to the inventive concepts.

Referring to FIG. 22, the variable resistance structure CR of the first memory cell MC1 may be disposed under the switching element SW of the first memory cell MC1, and the variable resistance structure CR of the second memory cell MC2 may be disposed on the switching element SW of the second memory cell MC2.

Figure 23:
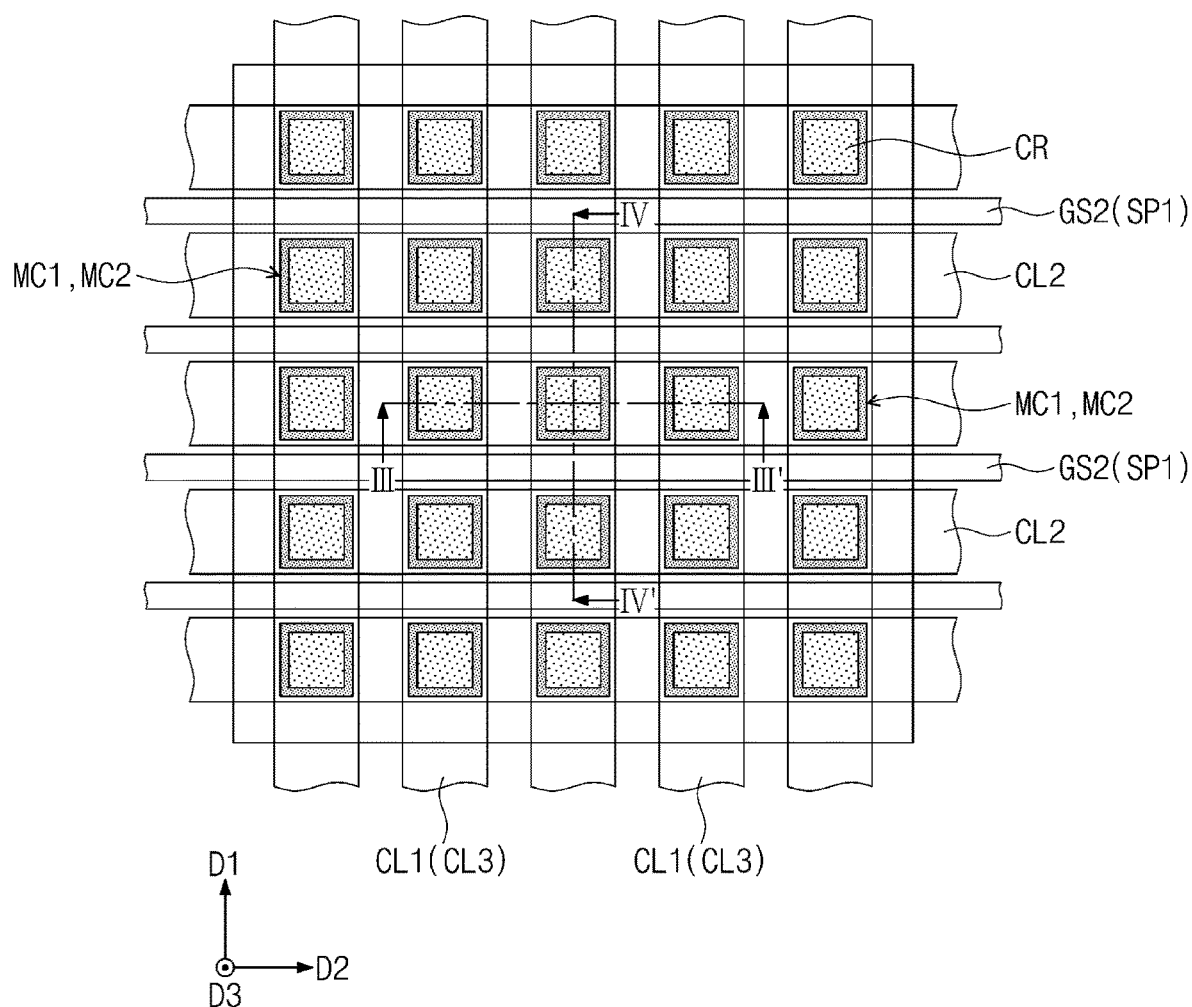
FIG. 23 is a plan view of examples of a variable resistance memory device according to the inventive concepts.
Figure 24:
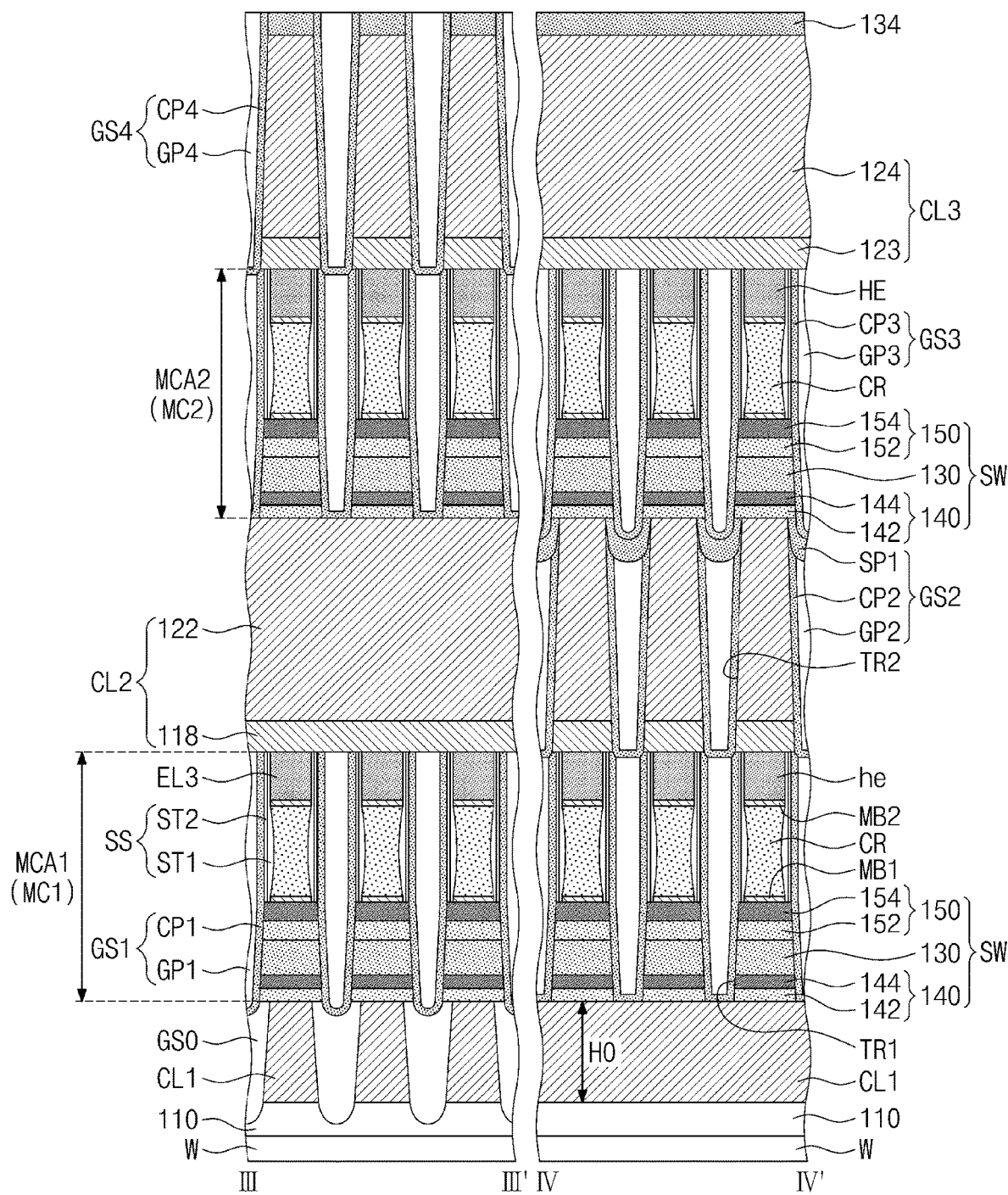
FIG. 24 is a cross-sectional view taken along lines and IV-IV' of FIG. 23.

FIG. 23 is a plan view of examples of a variable resistance memory device 100 according to the inventive concepts. FIG. 24 is a cross-sectional view taken along lines and IV-IV' of FIG. 23.

Referring to FIGS. 23 and 24, the second conductive lines CL2 may be provided between the first memory cells MC1 and second memory cells MC2, and a second filling structure GS2 may be provided in the second trench TR2 between the second conductive lines CL2.

The second filling structure GS2 may fill the second trench TR2 between the second conductive lines CL2. A plurality of the second trenches TR2 may extend in the second direction D2 and may be spaced apart from each other in the first direction D1. The second filling structure GS2 may have a bar or line shape extending in the second direction D2. In other words, a plurality of the second filling structures GS2 may be separated from each other with the second conductive lines CL2 interposed therebetween. The second filling structure GS2 may include a second capping pattern CP2, a second filling pattern GP2, and a first support pattern SP1. The second capping pattern CP2 may cover sidewalls of a pair of the second conductive lines CL2 adjacent to each other and may cover a top surface of the first filling structure GS1 exposed between the pair of second conductive lines CL2.

A lower portion of the second filling pattern GP2 may fill a lower portion of the second trench TR2, and an upper portion of the second filling pattern GP2 may be in contact with a bottom surface of the first support pattern SP1. The second filling pattern GP2 may be surrounded by the second capping pattern CP2 and the first support pattern SP1 when viewed in a cross-sectional view. The second filling pattern GP2 may extend in the second direction D2.

Each of the first support patterns SP1 may extend in the second direction D2 between the second conductive lines CL2, and the first support patterns SP1 may be spaced apart from each other in the first direction D1. The first support pattern SP1 may have a shape which is convex toward the first memory cells MC1 (i.e., the substrate W).

A third filling structure GS3 may be provided to fill a space between the second memory cells MC2. Components of the second memory cell MC2 may be substantially the same as the components of the first memory cell MC1. The third filling structure GS3 may have a lattice or mesh shape which includes portions extending in the first direction D1 and portions extending in the second direction D2. The third filling structure GS3 may include a third capping pattern CP3 and a third filling pattern GP3. In some examples, the third capping pattern CP3 may conformally cover sidewalls of the second memory cells MC2. The third filling pattern GP3 may fill a space surrounded by the third capping pattern CP3.

Third conductive lines CL3 may be provided on the heater electrodes HE of the second memory cells MC2. The third conductive lines CL3 may extend in the same direction as the first conductive lines CL1. The third conductive lines CL3 may extend in the first direction D1. The third conductive line CL3 may include a second barrier pattern 123 and a second line metal pattern 124. The second barrier pattern 123 may include a metal nitride such as TiN, WN, or TaN. The second line metal pattern 124 may include a metal material such as tungsten, titanium, or tantalum. A thickness of the second barrier pattern 123 may range from about $1/20$ to about $1/7$ of a thickness of the second line metal pattern 124. An upper mask pattern 134 may remain on the third conductive line CL3. Alternatively, the upper mask pattern 134 may not remain.

Fourth filling structures GS4 may be provided to fill spaces between the third conductive lines CL3. Each of the fourth filling structures GS4 may have a bar or line shape extending in the first direction D1. In other words, the fourth filling structures GS4 may be separated from each other with the third conductive lines CL3 interposed therebetween. Each of the fourth filling structures GS4 may include a fourth capping pattern CP4 and a fourth filling pattern GP4. Features of the fourth capping pattern CP4 and the fourth filling pattern GP4 may be substantially the same as the features of the second capping pattern CP2 and the second filling pattern GP2. Unlike the second filling structures GS2, the fourth filling structures GS4 may not include a support pattern.

The substrate W, the interlayer insulating layer 110, the first conductive line CL1, the switching element SW, the variable resistance structure CR, the first and second metal patterns MB1 and MB2, the heater electrode HE, the spacer structure SS and the first filling structure GS1 may be substantially the same as described with reference to FIG. 19. The vertical arrangement of the switching element SW and the variable resistance structure CR may be changed.

Figure 25:
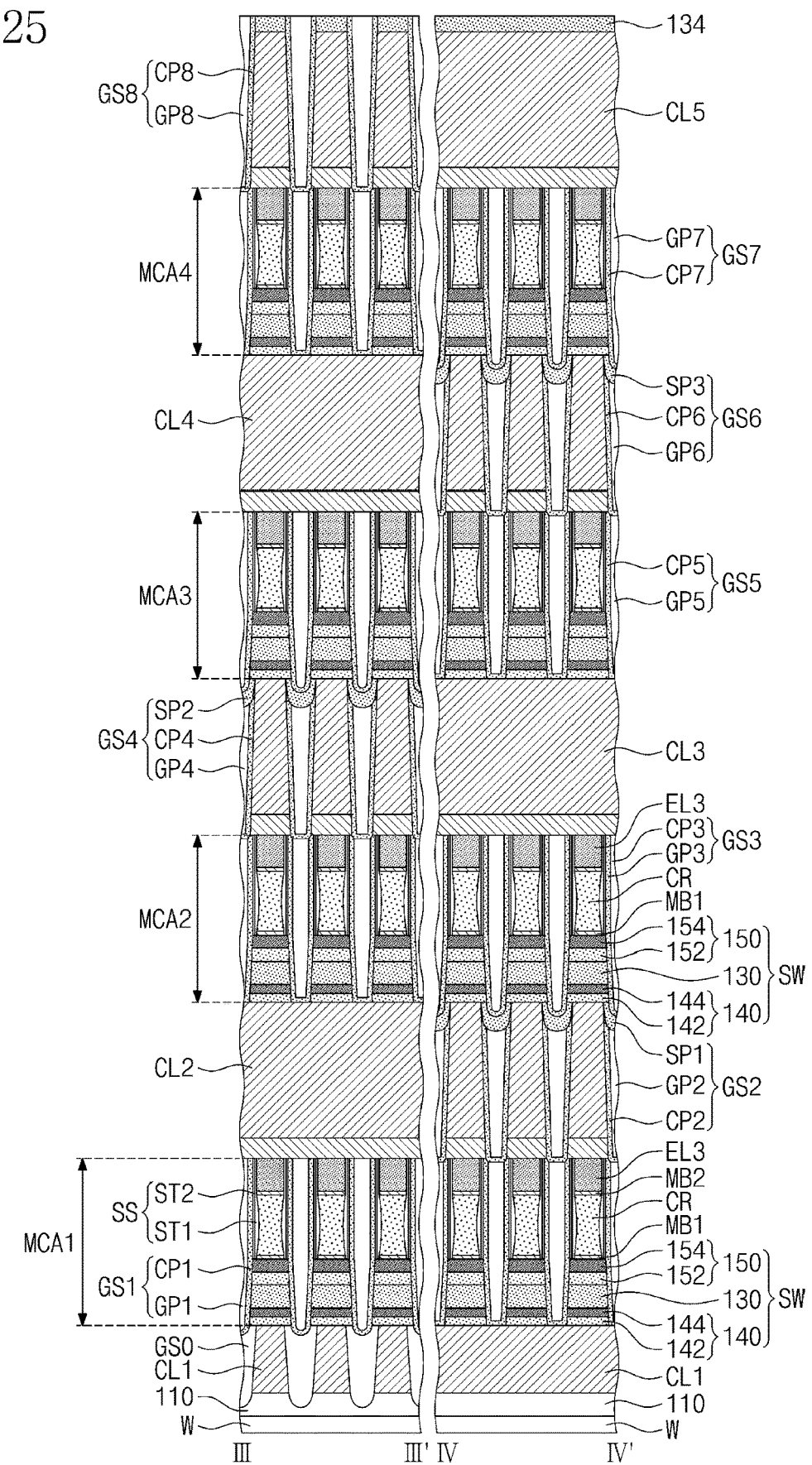
FIG. 25 is a cross-sectional view taken along the lines and IV-IV' of FIG. 23.

FIG. 25 is a cross-sectional view taken along the lines and IV-IV' of FIG. 23.

Referring to FIGS. 23 and 25, a variable resistance memory device 100 according to some embodiments of the inventive concepts may include first to fourth memory cell stacks MCA1 to MCA4. The first and second memory cell stacks MCA1 and MCA2 and first to third conductive lines CL1, CL2 and CL3 may be the same as described above.

Fourth conductive lines CL4 may be provided above the third conductive lines CL3, and fifth conductive lines CL5 may be provided above the fourth conductive lines CL4. The third memory cell stack MCA3 may be provided between the third conductive lines CL3 and the fourth conductive lines CL4, and the fourth memory cell stack MCA4 may be provided between the fourth conductive lines CL4 and the fifth conductive lines CL5. Components of each of the third and fourth memory cell stacks MCA3 and MCA4 may be substantially the same as the components of the second memory cell stack MCA2. A fifth filling structure GS5 may fill a space between memory cells of the third memory cell stack MCA3, and a seventh filling structure GS7 may fill a space between memory cells of the fourth memory cell stack MCA4. Each of the fifth and seventh filling structures GS5 and GS7 may be substantially the same as the third filling structure GS3 described above. For example, the fifth filling structure GS5 may include a fifth capping pattern CP5 and a fifth filling pattern GP5. The seventh filling structure GS7 may include a seventh capping pattern CP7 and a seventh filling pattern GP7.

Sixth filling structures GS6 may fill spaces between the fourth conductive lines CL4, and eighth filling structures GS8 may fill spaces between the fifth conductive lines CL5. Each of the sixth filling structures GS6 may be substantially the same as the second filling structure GS2. In the present embodiments, the fourth filling structure GS4 may further include a second support pattern SP2. Each of the sixth filling structures GS6 may include a sixth capping pattern CP6, a sixth filling pattern GP6, and a third support pattern SP3. Each of the eighth filling structures GS8 may include an eighth capping pattern CP8 and an eighth filling pattern GP8.

The substrate W, the interlayer insulating layer 110, the first conductive line CL1, the switching element SW, the variable resistance structure CR, the first and second metal patterns MB1 and MB2, the heater electrode HE, the spacer structure SS and the first filling structure GS1 may be substantially the same as described with reference to FIG. 19. The vertical arrangement of the switching element SW and the variable resistance structure CR may be changed.

Figure 26:
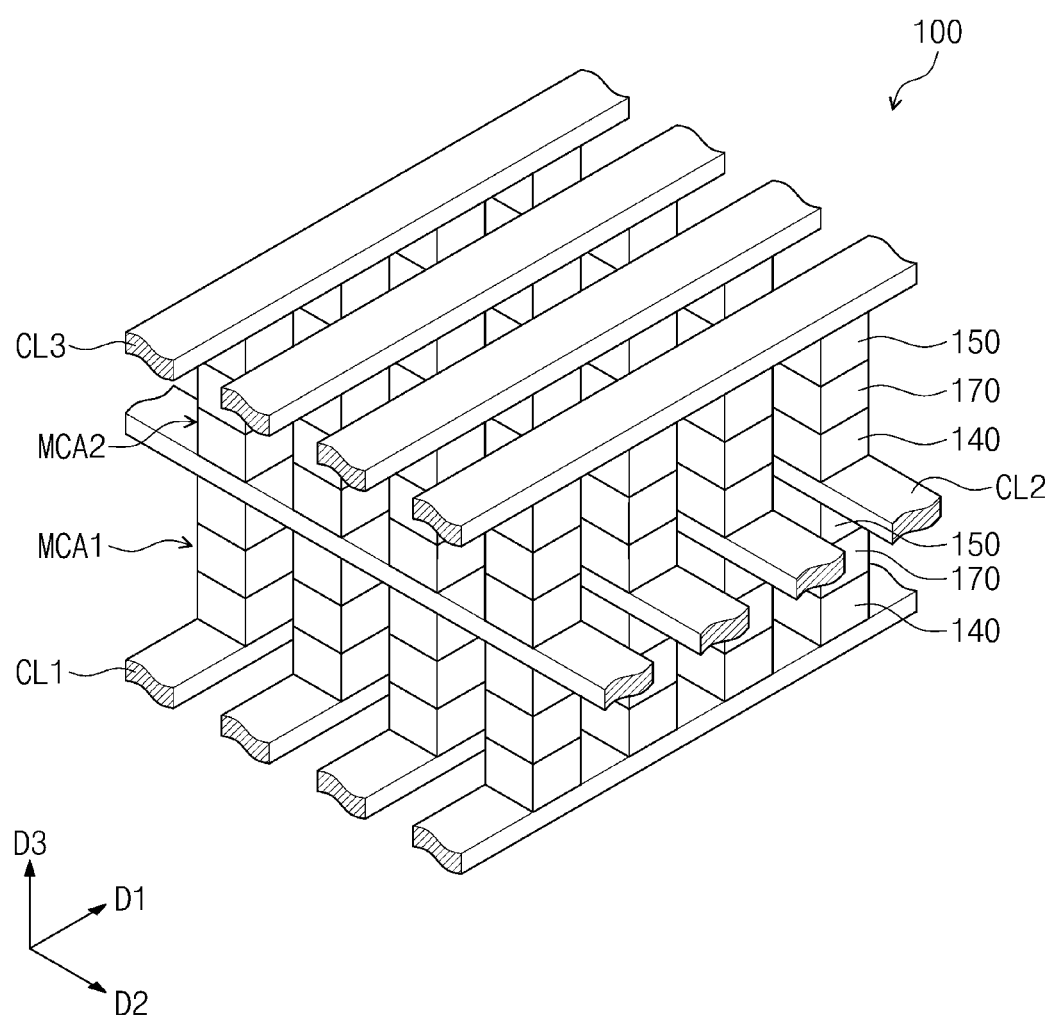
FIG. 26 is a perspective view of an example of a variable resistance memory device according to the inventive concepts.

FIG. 26 is a perspective view of an example of a variable resistance memory device 100 according to the inventive concepts.

Referring to FIG. 26, a variable resistance memory device 100 according to some embodiments of the inventive concepts may be a self-selection memory device or a self-selection variable resistance memory device. For example, each of memory cells of first and second memory cell stacks MCA1 and MCA2 may include a self-selector 170 between the lower barrier electrode 140 and the upper barrier electrode 150. The self-selector 170 may perform both a variable resistance memory operation and a switching operation on the basis of a current and/or a voltage provided to the first and second conductive lines CL1 and CL2 (or the second and third conductive lines CL2 and CL3). The lower barrier electrodes 140 may be provided between the self-selectors 170 and the first and second conductive lines CL1 and CL2. The upper barrier electrodes 150 may be provided between the self-selectors 170 and the second and third conductive lines CL2 and CL3.

The switching element according to the inventive concepts may minimize or prevent diffusion of constituent elements by the barrier electrode. In addition, the method of manufacturing the switching element according to the inventive concepts may increase the adhesive strength of the barrier electrode to minimize or prevent the leaning phenomenon and/or detachment of the switching element.

Although the inventive concepts have been described with reference to various examples thereof, it will be apparent to those skilled in the art that various changes and modifications may be made to the examples without departing from the spirit and scope of the inventive concepts. Therefore, it should be understood that the above examples are not limiting, but illustrative. Thus, the scope of the inventive concepts are to be determined by the broadest permissible interpretation of the following claims and shall not be restricted or limited by the foregoing description.

What is claimed is:

1. A switching element comprising:
   a lower barrier electrode;
   a switching pattern on the lower barrier electrode; and
   an upper barrier electrode on the switching pattern,
   wherein each of the lower barrier electrode and the upper barrier electrode includes carbon and an inert gas element, and
   wherein the lower barrier electrode further includes a larger amount of the inert gas element than the upper barrier electrode.

2. The switching element of claim 1, wherein the inert gas element includes argon.

3. The switching element of claim 1, wherein the upper barrier electrode comprises:
   a first upper barrier electrode; and
   a second upper barrier electrode disposed on the first upper barrier electrode,
   wherein the second upper barrier electrode includes a larger amount of the inert gas element than the first upper barrier electrode.

4. The switching element of claim 3, wherein the first upper barrier electrode further includes carbon, and
   wherein the second upper barrier electrode further includes carbon nitride.

5. The switching element of claim 3, wherein a density of the second upper barrier electrode is greater than a density of the first upper barrier electrode.

6. The switching element of claim 5, wherein the upper barrier electrode further comprises:
   a third upper barrier electrode disposed between the first and second upper barrier electrodes.

7. The switching element of claim 6, wherein the third upper barrier electrode includes the inert gas element; and the amount of the inert gas element of the third upper barrier electrode is more than the amount of the inert gas element of the first upper barrier electrode and is less than the amount of the inert gas element of the second upper barrier electrode.

8. The switching element of claim 1, wherein the lower barrier electrode comprises:
   a first lower barrier electrode; and
   a second lower barrier electrode disposed between the first lower barrier electrode and the switching pattern,
   wherein the second lower barrier electrode includes a larger amount of the inert gas element than the first lower barrier electrode.

9. The switching element of claim 8, wherein the first lower barrier electrode further includes carbon nitride, and
   wherein the second lower barrier electrode further includes carbon.

10. The switching element of claim 8, wherein the lower barrier electrode further comprises:
    a third lower barrier electrode disposed between the first and second lower barrier electrodes,
    wherein the third lower barrier electrode includes the inert gas element; and the amount of the inert gas element of the third lower barrier electrode is more than the amount of the inert gas element of the first lower barrier electrode and is less than the amount of the inert gas element of the second lower barrier electrode.

11. A switching element comprising:
    a lower barrier electrode on a substrate;
    a switching pattern on the lower barrier electrode; and
    an upper barrier electrode on the switching pattern,
    wherein the upper barrier electrode comprises:
    a first upper barrier electrode; and
    a second upper barrier electrode disposed on the first upper barrier electrode, wherein the second upper barrier electrode includes a larger amount of an inert gas element than the first upper barrier electrode.

12. The switching element of claim 11, wherein the first upper barrier electrode further includes carbon, and
wherein the second upper barrier electrode further includes carbon nitride.

13. The switching element of claim 11, wherein the lower barrier electrode comprises:
a first lower barrier electrode; and
a second lower barrier electrode between the first lower barrier electrode and the switching pattern,
wherein the second lower barrier electrode includes a larger amount of an inert gas element than the first lower barrier electrode.

14. The switching element of claim 13, wherein the first lower barrier electrode further includes carbon nitride, and
wherein the second lower barrier electrode further includes carbon.

15. The switching element of claim 11, wherein the upper barrier electrode further comprises: a third upper barrier electrode disposed between the first and second upper barrier electrodes,
wherein the third upper barrier electrode includes the inert gas element; and the amount of the inert gas element of the third upper barrier electrode is more than the amount of the inert gas element of the first upper barrier electrode and is less than the amount of the inert gas element of the second upper barrier electrode.

16. A variable resistance memory device comprising:
a first conductive line extending in a first direction;
a second conductive line extending in a second direction intersecting the first direction;
a variable resistance structure disposed between the first and second conductive lines; and
a switching element disposed between the variable resistance structure and the second conductive line or between the variable resistance structure and the first conductive line,
wherein the switching element comprises:
a lower barrier electrode;
a switching pattern on the lower barrier electrode; and
an upper barrier electrode on the switching pattern,
wherein each of the lower barrier electrode and the upper barrier electrode includes carbon, and
wherein the lower barrier electrode further includes a larger amount of an inert gas element than the upper barrier electrode.

17. The variable resistance memory device of claim 16, wherein the upper barrier electrode comprises:
a first upper barrier electrode; and
a second upper barrier electrode which is disposed on the first upper barrier electrode and has a density greater than a density of the first upper barrier electrode.

18. The variable resistance memory device of claim 17, wherein the upper barrier electrode further comprises: a third upper barrier electrode between the first and second upper barrier electrodes.

19. The variable resistance memory device of claim 17, wherein the second upper barrier electrode includes carbon nitride.

20. The variable resistance memory device of claim 19, wherein the second conductive line comprises:
a line metal pattern; and
a barrier pattern disposed between the line metal pattern and the second upper barrier electrode and including a metal nitride.

* * * * *